(12) United States Patent
Nam et al.

(10) Patent No.: US 10,043,583 B2
(45) Date of Patent: Aug. 7, 2018

(54) NONVOLATILE MEMORY DEVICE AND METHOD OF READING THE SAME

(71) Applicants: Sang-wan Nam, Hwaseong-si (KR); Dae-seok Byeon, Seongnam-si (KR); Chi-weon Yoon, Seoul (KR)

(72) Inventors: Sang-wan Nam, Hwaseong-si (KR); Dae-seok Byeon, Seongnam-si (KR); Chi-weon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/447,357

(22) Filed: Mar. 2, 2017

(65) Prior Publication Data

US 2018/0137925 A1    May 17, 2018

(30) Foreign Application Priority Data

Nov. 14, 2016    (KR) ......................... 10-2016-0151307

(51) Int. Cl.
| | |
|---|---|
| *G11C 11/34* | (2006.01) |
| *G11C 16/34* | (2006.01) |
| *G11C 16/04* | (2006.01) |
| *G11C 16/28* | (2006.01) |
| *G11C 16/10* | (2006.01) |
| *G11C 16/16* | (2006.01) |

(52) U.S. Cl.
CPC ...... *G11C 16/3431* (2013.01); *G11C 16/0483* (2013.01); *G11C 16/10* (2013.01); *G11C 16/16* (2013.01); *G11C 16/28* (2013.01); *G11C 16/3459* (2013.01)

(58) Field of Classification Search
CPC . G11C 16/3431; G11C 16/0483; G11C 16/10; G11C 16/16
USPC .................................................. 365/185.17
See application file for complete search history.

(56) References Cited

U.S. PATENT DOCUMENTS

| | | |
|---|---|---|
| 7,679,133 B2 | 3/2010 | Son et al. |
| 8,107,292 B2 | 1/2012 | Maejima |
| 8,488,381 B2 | 7/2013 | Kim et al. |
| 8,553,466 B2 | 10/2013 | Han et al. |
| 8,559,235 B2 | 10/2013 | Yoon et al. |
| 8,638,608 B2 | 1/2014 | Lai et al. |
| 8,654,587 B2 | 2/2014 | Yoon et al. |

(Continued)

*Primary Examiner* — Anthan Tran
(74) *Attorney, Agent, or Firm* — Harness, Dickey & Pierce, P.L.C.

(57) ABSTRACT

Provided are a nonvolatile memory device and a method of performing a sensing operation on the nonvolatile memory device. The nonvolatile memory device includes a control logic coupled to a memory cell array including strings. The control logic is configured to control a first weak-on voltage applied to an unselected string selection line and a second weak-on voltage applied to an unselected ground selection line during a setup interval of the sensing operation for sensing data from a selected string. The unselected string selection line and ground selection line are connected to a string selection transistor and a ground selection transistor, respectively, of a same unselected string. The selected string and the unselected string are connected to a same bit line. The first weak-on voltage and second weak-on voltage are respectively less than a threshold voltage of the string selection transistor and the ground selection transistor in the unselected string.

15 Claims, 30 Drawing Sheets

(56) References Cited

U.S. PATENT DOCUMENTS

| | | |
|---|---|---|
| 8,670,285 B2 | 3/2014 | Dong et al. |
| 8,942,042 B2 | 1/2015 | Lee et al. |
| 9,087,601 B2 | 7/2015 | Dutta et al. |
| 9,142,313 B2 | 9/2015 | Shim et al. |
| 9,171,632 B2 | 10/2015 | Dong et al. |
| 9,286,994 B1 | 3/2016 | Chen et al. |
| 9,349,464 B2 | 5/2016 | Shiga et al. |
| 9,361,993 B1 | 6/2016 | Chen et al. |
| 2011/0233648 A1 | 9/2011 | Seol et al. |
| 2012/0039130 A1* | 2/2012 | Yoon ................ G11C 16/0483 365/185.18 |
| 2013/0088921 A1* | 4/2013 | Nam ................ G11C 16/0483 365/185.17 |
| 2013/0182505 A1* | 7/2013 | Liu ................ G11C 16/10 365/185.17 |
| 2014/0241069 A1 | 8/2014 | Kwak et al. |
| 2014/0334232 A1 | 11/2014 | Nam et al. |
| 2016/0027513 A1* | 1/2016 | Lee ................ G11C 16/10 365/185.02 |
| 2016/0232981 A1 | 8/2016 | Nam |

\* cited by examiner

NONVOLATILE MEMORY DEVICE AND METHOD OF READING THE SAME

CROSS-REFERENCE TO RELATED APPLICATION

This application claims the benefit of Korean Patent Application No. 10-2016-0151307, filed on Nov. 14, 2016, in the Korean Intellectual Property Office, the disclosure of which is incorporated herein in its entirety by reference.

BACKGROUND

The present disclosure relates to a memory device, and more particularly, to a nonvolatile memory device and/or a method of reading the same.

Memory devices are used for storing data and are divided into volatile memory devices and nonvolatile memory devices. As an example of a nonvolatile memory device, a flash memory device may be used in mobile phones, digital cameras, portable digital assistants (PDAs), portable computer devices, fixed computer devices, and other devices.

SUMMARY

Inventive concepts relate to a nonvolatile memory device capable of suppressing a reading disturbance and/or a method of reading the same.

According to some example embodiment of inventive concepts, there is provided a method of reading a nonvolatile memory device, in which a plurality of cell strings are connected to a single bit line, wherein each of the plurality of cell strings includes selection transistors and a plurality of memory cells. The method includes applying a turn-on voltage to selected selection lines connected to selection transistors included in a selected cell string of the plurality of cell strings, applying weak-on voltages having a voltage level lower than voltage levels of threshold voltages of the selection transistors to unselected selection lines connected to selection transistors included in unselected cell strings of the plurality of cell strings, and applying a pass voltage and a read voltage to word lines connected to the plurality of memory cells of the plurality of cell strings.

According to some example embodiments of inventive concepts, a nonvolatile memory device includes a control logic coupled to a memory cell array. The memory cell array includes strings connected to bit lines, word lines, string selection lines, and ground selection lines. Each of the strings include memory cells connected in series between a string selection transistor and a ground selection transistor. The control logic is configured to control a first weak-on voltage applied to an unselected string selection line among the string selection lines and a second weak-on voltage applied to an unselected ground selection line among the ground selection lines during a setup interval of a sensing operation for sensing data from a selected string among the strings. The unselected string selection line and the unselected ground selection line are connected to the string selection transistor and the ground selection transistor, respectively, of a same unselected string among the strings. The selected string and the unselected string are connected in common to a same one of the bit lines. A level of the first weak-on voltage is less than a threshold voltage of the string selection transistor in the unselected string and greater than a ground voltage. A level of the second weak-on voltage is less than a threshold voltage of the ground selection transistor of the unselected string and greater than the ground voltage.

According to some example embodiments of inventive concepts, a nonvolatile memory device includes a memory cell array including strings connected to bit lines, a row decoder connected to the strings, a voltage generator connected to the row decoder, and a control logic coupled to the row decoder and the voltage generator. Each of the strings include memory cells connected in series between a string selection transistor and a ground selection transistor. The row decoder is connected to the strings through word lines, string selection lines, and ground selection lines. The control logic is configured to control the voltage generator and the row decoder to apply a first weak-on voltage to an unselected string selection line among the string selection lines and a second weak-on voltage to an unselected ground selection line among the ground selection lines during a setup interval of a sensing operation for sensing data from a selected string among the strings. The unselected string selection line and the unselected ground selection line are connected to the string selection transistor and the ground selection transistor, respectively, of a same unselected string among the strings. The selected string and the unselected string are connected in common to a same one of the bit lines. A level of the first weak-on voltage is less than a threshold voltage of the string selection transistor in the unselected string and greater than a ground voltage. A level of the second weak-on voltage is less than a threshold voltage of the ground selection transistor of the unselected string and greater than the ground voltage.

According to some example embodiments of inventive concepts, a method of operating a nonvolatile memory device is provided. The nonvolatile memory device includes a control logic coupled to a memory cell array. The method includes applying a first weak-on voltage to an unselected string selection line and a second weak-on voltage to an unselected ground selection line during a setup interval of a sensing operation for sensing data from a selected string, and sensing the data from the selected string during a sensing interval of the sensing operation that occurs after the setup interval. The unselected string selection line and unselected ground selection line are connected to a string selection transistor and a ground selection transistor, respectively, of a same unselected string. The selected string and the unselected string are connected in common to a bit line in the memory cell array. A level of the first weak-on voltage is less than a threshold voltage of the string selection transistor in the unselected string and greater than a ground voltage. A level of the second weak-on voltage is less than a threshold voltage of the ground selection transistor of the unselected string and greater than a ground voltage.

According to some example embodiments of inventive concepts, a control logic includes a voltage controller configured to provide a row address and a column address to a row decoder and a page buffer, respectively, that are coupled to a memory cell array, based on a command, address, and control signal received from an external host. The voltage controller is configured to generate a voltage control signal for controlling a voltage generator coupled to the row decoder, such that the voltage generator and the row decoder are controlled to apply a first weak-on voltage to an unselected string selection line among and a second weak-on voltage to an unselected ground selection line during a setup interval of a sensing operation for sensing data from a selected string of the memory cell array. The unselected string selection line and the unselected ground selection line are connected to a same unselected string. The selected string and the unselected string are connected to a same bit line. A level of the first weak-on voltage is less than a threshold voltage of a string selection transistor of the unselected string and greater than a ground voltage. A level of the second weak-on voltage is less than a threshold voltage of a ground selection transistor of the unselected string and greater than the ground voltage.

BRIEF DESCRIPTION OF THE DRAWINGS

Example embodiments of inventive concept will be more clearly understood from the following detailed description taken in conjunction with the accompanying drawings in which.

DETAILED DESCRIPTION OF EXAMPLE EMBODIMENTS

As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments of inventive concepts will be described with reference to the accompanying drawings.

Figure 1:
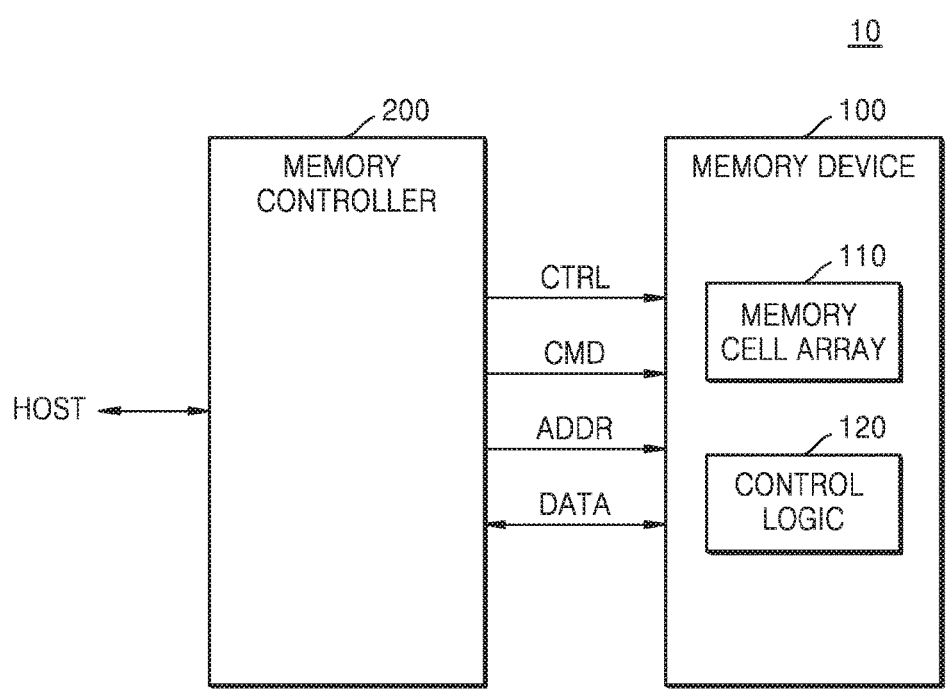
FIG. 1 is a block diagram schematically illustrating a memory system according to some example embodiments of inventive concepts.

FIG. 1 is a block diagram schematically illustrating a memory system 10 according to some example embodiments of inventive concepts.

Referring to FIG. 1, the memory system 10 may include a memory device 100 and a memory controller 200, and the memory device 100 may include a memory cell array 110 and a control logic 120. The memory device 100 may be a nonvolatile memory device.

The memory cell array 110 may include a plurality of memory cells, and the plurality of memory cells may be, for example, flash memory cells. Hereinafter, a case in which the plurality of memory cells are NAND flash memory cells will be described as an example. However, inventive concepts are not limited thereto, and the plurality of memory cells may be various types of nonvolatile memory cells. In some example embodiments, the plurality of memory cells may be resistive memory cells such as resistive random-access memories (RRAMs), phase change RAMs (PRAMs), and magnetic RAMs (MRAMs).

In FIG. 1, the memory cell array 110 may include a plurality of cell strings which share a bit line. Each of the plurality of cell strings may include at least one ground selection transistor, which is connected to at least one ground selection line, word lines, and at least one string selection line, memory cells, and a string selection transistor. The memory cell array 110 may be a two-dimensional (2D) memory array. Alternatively, the memory cell array 110 may be a three-dimensional (3D) memory array.

The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

The 3D memory array may include cell strings disposed in a vertical direction so that at least one memory cell is located on another memory cell. The at least one memory cell may include a charge trapping layer. The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Also, U.S. Patent Publication No. 2014-0334232 and U.S. Pat. No. 8,488,381 are applied to the present specification as references.

The control logic 120 may control voltages applied to unselected selection lines connected to selection transistors included in an unselected cell string to be lower than threshold voltages of corresponding selection transistors in at least part of a sensing interval in which a sensing operation (e.g., a read operation according to a read command from the memory controller 200, or a read operation when a verification operation is performed after a program operation) is performed on a selected memory cell of the memory cells included in the memory cell array 110. In this manner, the voltages lower than the threshold voltages of the corresponding selection transistors may be referred to as weak-on voltages. In this case, the selection transistors may include a ground selection transistor and/or a string selection transistor, and the unselected selection lines may include an unselected ground selection line and/or an unselected string selection line. Therefore, a ground selection voltage applied to the unselected ground selection line is lower than a threshold voltage of the ground selection transistor, and a string selection voltage applied to the unselected string selection line is lower than a threshold voltage of the string selection transistor.

The weak-on voltages are voltages greater than a ground voltage and lower than the threshold voltages of the selection transistors. The weak-on voltages do not fully turn-on the selection transistors included in the unselected cell string. The weak-on voltages weakly turn-on the selection transistors so that a leakage current flows in the selection transistors. When a read operation is performed on a selected memory cell, the control logic 120 may adjust levels of the weak-on voltages and/or a time at which the weak-on voltages are provided to the selection lines so that a channel boosting potential of the selected cell string and channel boosting potentials of the unselected cell strings which share the bit line are uniform in an entire section of a channel.

The memory controller 200 may control the memory device 100 to read data stored in the memory device 100 or to write the data to the memory device 100 in response to a read/write request from a host HOST. Specifically, the memory controller 200 may control program (or write), read, and erase operations with respect to the memory device 100 by providing an address ADDR, a command CMD, and a control signal CTRL to the memory device 100. Further, data DATA for a program operation and read data DATA may be exchanged between the memory controller 200 and the memory device 100.

Although not illustrated, the memory controller 200 may include a RAM, a processing unit (e.g., processing circuit), a host interface, and a memory interface. The RAM may be used as an operation memory of the processing unit, and the processing unit may control operations of the memory controller 200. The host interface may include a protocol for performing data exchange between the host HOST and the memory controller 200. For example, the memory controller 200 may be formed to communicate with the outside HOST through at least one of various interface protocols such as a Universal Serial Bus (USB), a MultiMedia Card (MMC), peripheral component interconnect express (PCI-E), advanced technology attachment (ATA), serial ATA, parallel ATA, a small computer system interface (SCSI), an enhanced small disk interface (ESDI), integrated drive electronics (IDE), and the like.

Figure 2:
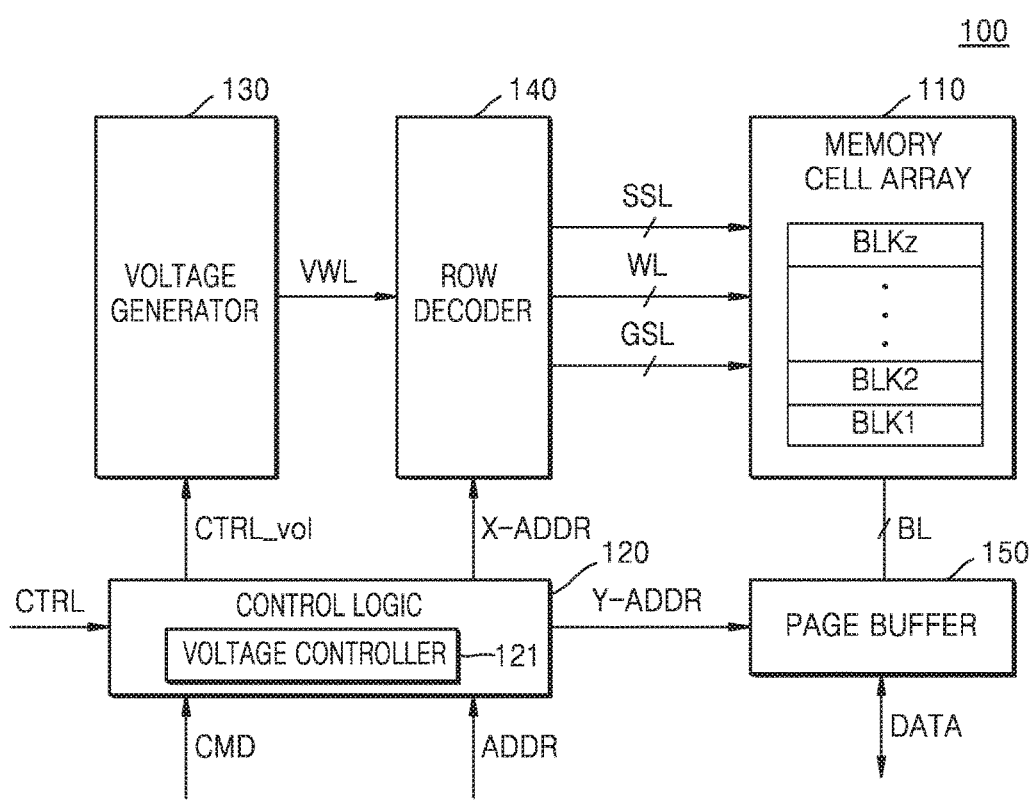
FIG. 2 is a block diagram illustrating a memory device included in FIG. 1 in detail.

FIG. 2 is a block diagram illustrating the memory device 100 included in FIG. 1 in detail.

Referring to FIG. 2, the memory device 100 may include the memory cell array 110, the control logic 120 coupled to the memory cell array 110, a voltage generator 130, a row decoder 140, and a page buffer 150. Although not illustrated, the memory device 100 may further include a data input and output circuit or an input and output interface.

The memory cell array 110 may include a plurality of memory cells, and may be connected to word lines WL, string selection lines SSL, ground selection lines GSL, and bit lines BL. Specifically, the memory cell array 110 may be connected to the row decoder 140 through the word lines WL, the string selection lines SSL, and the ground selection lines GSL, and may be connected to the page buffer 150 through the bit lines BL. The voltage generator 130 may be connected to the row decoder 140. The control logic 120 may be coupled to the row decoder 140 and the voltage generator 130.

The memory cell array 110 may include a plurality of memory blocks BLK1 to BLKz. Each memory block may have a 2D structure or a 3D structure (or a vertical structure). The memory blocks BLK1 to BLKz may be selected by the row decoder 140. For example, the row decoder 140 may select a memory block corresponding to a block address from the memory blocks BLK1 to BLKz. At least one of the memory blocks BLK1 to BLKz may include a plurality of cell strings which share a bit line.

The memory cell array 110 may include at least one of a single-level cell block including single-level cells, a multi-level cell block including multi-level cells, and a triple-level cell block including triple-level cells. In other words, some of the plurality of memory blocks included in the memory cell array 110 may be single-level cell blocks, and the other memory blocks thereof may be multi-level cell blocks or triple-level cell blocks.

The control logic 120 may output various types of control signals for writing data to the memory cell array 110 or for reading the data from the memory cell array 110 based on the command CMD, the address ADDR and the control signal CTRL, which are received from the memory controller 200. Thus, the control logic 120 may by and large control various types of operations in the memory device 100.

Various types of control signals output from the control logic 120 may be provided to the voltage generator 130, the row decoder 140, and the page buffer 150. Specifically, the control logic 120 may provide a voltage control signal CTRL_vol to the voltage generator 130, may provide a row address X-ADDR to the row decoder 140, and may provide a column address Y-ADDR to the page buffer 150. However, inventive concepts are not limited thereto, and the control logic 120 may further provide other control signals to the voltage generator 130, the row decoder 140, and the page buffer 150.

The control logic 120 may include a voltage controller 121. The voltage controller 121 may generate the voltage control signal CTRL_vol, which is used to generate a word line voltage for driving the word lines WL, a string selection line voltage for driving the string selection lines SSL, and a ground selection line voltage for driving the ground selection lines GSL. The voltage generator 130 may generate voltages VWL such as the string selection line voltage, the ground selection line voltage, and the word line voltage under control of the voltage controller 121 according to the voltage control signal CTRL_vol. The voltage generator 130 may provide the voltages VWL to the row decoder 140 and the row decoder 140 may provide the voltages VWL to the memory cell array 110.

In some example embodiments, when a read operation is performed, the voltage controller 121 may control the voltage generator 130 so that weak-on voltages lower than the threshold voltages of the selection transistors are applied to the unselected selection lines in at least part of a reading interval. Further, the voltage controller 121 may control the voltage generator 130 so that the weak-on voltages are applied to the unselected selection lines during a setup interval of the reading interval (hereinafter referred to as a read setup interval). In this case, the read setup interval may refer to a time interval in which voltages of unselected word lines reach a pass voltage when the pass voltage is applied to the unselected word lines. In a case where inventive concepts are applied to a program verification operation, the setup interval may be referred to as a verification setup interval.

In some example embodiments, the voltage controller 121 may adjust levels of the weak-on voltages and/or application times of the weak-on voltages based on at least one of the threshold voltages of the selection transistors, sizes of the selection transistors, a temperature, the address ADDR, and a program pattern.

The voltage generator 130 may generate various types of voltages for performing program, read, and erase operations with respect to the memory cell array 110 based on the voltage control signal CTRL_vol. Specifically, the voltage generator 130 may generate a word line voltage, for example, a program voltage (or a write voltage), a read voltage, a program inhibit voltage, a read inhibit voltage, an erase verification voltage, a program verification voltage, or the like. Further, the voltage generator 130 may generate a string selection line voltage and a ground selection line voltage based on the voltage control signal CTRL_vol. The voltage generator 130 may generate a turn-on voltage as a string selection line voltage and a ground selection line voltage which are provided to the selected cell string, and may generate a weak-on voltage as a string selection voltage and a ground selection line voltage which are provided to the unselected cell string.

The row decoder 140 may select some word lines from the word lines WL in response to the row address X-ADDR received from the control logic 120. Specifically, when a read operation is performed, the row decoder 140 may apply a read voltage to a selected word line, and may apply a read pass voltage to unselected word lines. Further, when a program operation is performed, the row decoder 140 may apply a program voltage to a selected word line, and may apply a program pass voltage to unselected word lines. Further, the row decoder 140 may select some string selection lines from the string selection lines SSL or some ground selection lines from the ground selection lines GSL in response to the row address X-ADDR received from the control logic 120.

The row decoder 140 may apply the weak-on voltages to unselected string selection lines and/or unselected ground selection lines in at least part of the reading interval. String selection transistors connected to the unselected string selection lines and/or ground selection transistors connected to the unselected ground selection lines may be weakly turned-on by the applied weak-on voltages. A boosting charge in a channel of the unselected cell string may be slowly discharged to the bit lines or a common source line through the weakly turned-on string selection transistors and ground selection transistors. Thus, a boosting potential in the channel of the unselected cell string may be limited and/or prevented from being excessively increased, and the boosting potential in the channel may be uniform.

The page buffer 150 may be connected to the memory cell array 110 through the bit lines BL, and may select some bit lines from the bit lines BL in response to the column address Y-ADDR received from the control logic 120. Specifically, when a read operation is performed, the page buffer 150 may operate as a sense amplifier to detect the data DATA stored in the memory cell array 110. Meanwhile, when a program operation is performed, the page buffer 150 may operate as a write driver to input the data DATA to be stored in the memory cell array 110.

As described above, in the memory device 100 according to some example embodiments of inventive concepts and the method of reading the same, as the weak-on voltages are applied to unselected selection lines connected to an unselected cell string, for example, an unselected ground selection line and/or a string selection line in at least part of the reading interval, for example, in the read setup interval, a boosting potential in a channel of the unselected cell string may be limited and/or prevented from being excessively increased, and the boosting potential in the channel may be uniform. Thus, hot carrier injection (HCI) and Fowler-Nordheim (FN) tunnelling caused by excessive channel boosting or a boosting potential difference in the channel may be limited and/or prevented from occurring, and a reading disturbance may be suppressed.

Figure 3:
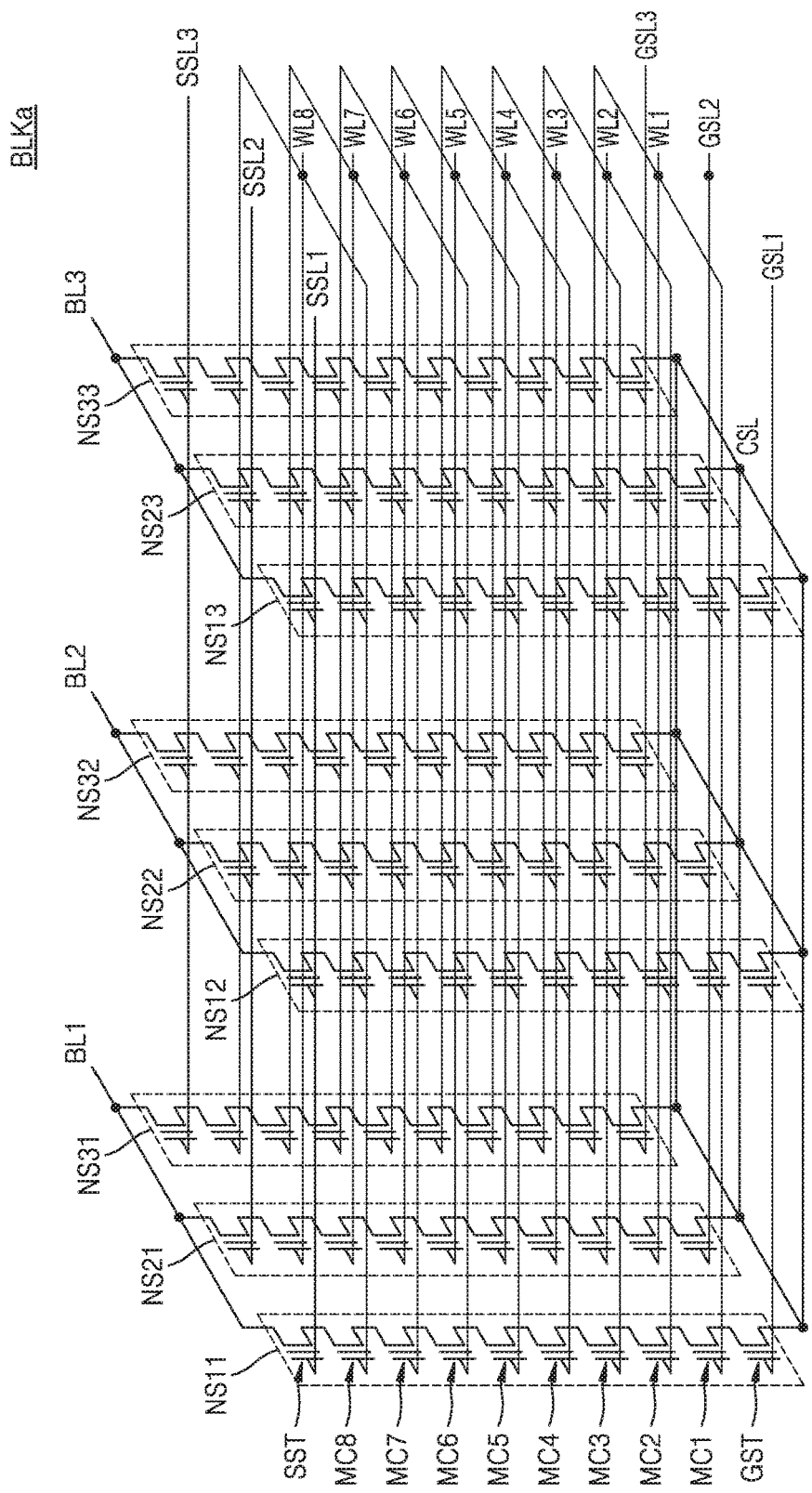
FIG. 3 is a circuit diagram illustrating an equivalent circuit of a memory block of FIG. 2.

FIG. 3 is a circuit diagram illustrating an equivalent circuit of the memory block BLKa of FIG. 2.

Referring to FIG. 3, the memory block BLKa may be a NAND flash memory having a vertical structure, and at least one of the memory blocks BLK1 to BLKz illustrated in FIG. 2 may be implemented as illustrated in FIG. 3. The memory block BLKa may include a plurality of NAND cell strings NS11 to NS33 connected to a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of cell strings, the number of word lines, the number of bit lines, the number of ground selection lines, and the number of string selection lines may be variously changed in some example embodiments.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., NS11) may include a string selection transistor SST, a plurality of memory cells MC1 to MC8, and a ground selection transistor GST, which are connected in series. In some example embodiments, dummy cells may be disposed between the string selection transistor SST and the plurality of memory cells MC1 to MC8 and between the ground selection transistor GST and the plurality of memory cells MC1 to MC8. Hereinafter, the NAND cell string is referred to as a cell string for convenience of description.

Cell strings commonly connected to a single bit line constitute a single column. For example, the cell strings NS11, NS21, and NS31 commonly connected to the first bit line BL1 may correspond to a first column, the cell strings NS12, NS22, and NS32 commonly connected to the second bit line BL2 may correspond to a second column, and the cell strings NS13, NS23, and NS33 commonly connected to the third bit line BL3 may correspond to a third column. Cell strings included in a single column may share a single bit line and word lines. For example, the cell strings NS11, NS21, and NS31 may share the first bit line BL1 and the word lines WL1 to WL8.

The string selection lines SSL1 to SSL3 are separated from each other, and the string selection transistor SST is connected to the corresponding string selection lines SSL1 to SSL3. Strings connected to a single string selection line constitute a single row. For example, the strings NS11, NS12, and NS13 connected to a first string selection line SSL1 may correspond to a first row, the strings NS21, NS22, NS23 connected to a second string selection line SSL2 may correspond to a second row, and the strings NS31, NS32, and NS33 connected to a third string selection line SSL3 may correspond to a third row.

The ground selection lines GSL1 to GSL3 are also separated from each other, and the ground selection transistor GST is connected to the corresponding ground selection lines GSL1 to GSL3. The string selection transistor SST is connected to the corresponding bit lines BL1 to BL3, and the ground selection transistor GST is connected to the common source line CSL.

The plurality of memory cells MC1 to MC8 are connected to the corresponding word lines WL1 to WL8, respectively. Memory cells located at the same height from the substrate (or the ground selection transistors GST) may be commonly connected to a single word line, and memory cells located at different heights may be respectively connected to different word lines WL1 to WL8. For example, the first memory cells MC1 may be commonly connected to a first word line WL1, and the second memory cells MC2 may be commonly connected to a second word line WL2.

Cell strings included in a single column may share a single bit line and word lines. For example, the cell strings NS11, NS21, and NS31 may share the first bit line BL1 and the word lines WL1 to WL8. Further, cell strings included in a single row may share a string selection line, a ground selection line, and word lines. For example, the cell strings NS11, NS12, and NS13 may share the first string selection line SSL1, a first ground selection line GSL1, and the word lines WL1 to WL8. Thus, when data is read from the memory cells which are connected to the first word line WL1 and included in the cell strings NS11, NS12, and NS13, the first word line WL1, the first string selection line SSL1, and the first ground selection line GSL1 may be selected.

Figure 4:
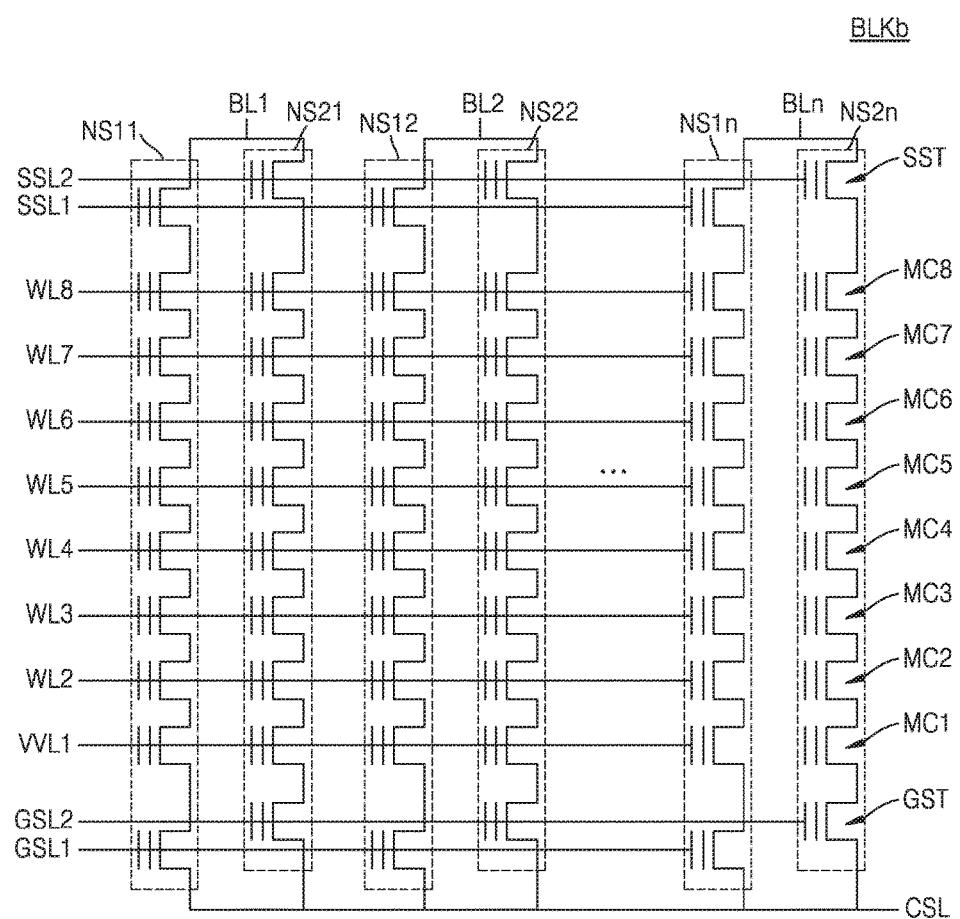
FIG. 4 is a circuit diagram illustrating an equivalent circuit of the memory block of FIG. 2.

FIG. 4 is a circuit diagram illustrating an equivalent circuit of the memory block of FIG. 2.

Referring to FIG. 4, a memory block BLKb may be a NAND flash memory having a horizontal structure, and at least one of the memory blocks BLK1 to BLKz illustrated in FIG. 2 may be implemented as illustrated in FIG. 4. The memory block BLKb may include a plurality of cell strings NS11 to NS23, a plurality of word lines WL1 to WL8, a plurality of bit lines BL1 to BLn, a plurality of ground selection lines GSL1 and GSL2, a plurality of string selection lines SSL1 and SSL2, and a common source line CSL. Here, the number of cell strings, the number of word lines, the number of bit lines, the number of ground selection line, and the number of string selection lines may be variously changed in some example embodiments.

A configuration of each of the plurality of cell strings NS11 to NS23 and a connection relationship thereof are similar to those of the cell strings NS11 to NS33 illustrated in FIG. 3. Therefore, a detailed description thereof will be omitted.

The plurality of cell strings may share the word lines WL1 to WL8, and at least two cell strings may share a single bit line. Cell strings which share a single bit line may each be connected to different string selection lines and different ground selection lines. For example, the cell strings NS11 and NS21 may share a first bit line BL1, a string selection transistor SST and a ground selection transistor GST of the cell string NS11 may be connected to a first string selection line SSL1 and a first ground selection line GSL1, respectively, and a string selection transistor SST and a ground selection transistor GST of the cell string NS21 may be connected to a second string selection line SSL2 and a second ground selection line GSL2, respectively. Thus, when data is read from the memory cells which are connected to the first word line WL1 and included in the cell strings NS11, NS12 to NS1$n$, the first word line WL1, the first string selection line SSL1, and the first ground selection line GSL1 may be selected.

The equivalent circuits of the memory block have been described with reference to FIGS. 3 and 4. However, inventive concepts are not limited thereto, and memory blocks having various structures including a plurality of cell strings which share a bit line may be variously modified.

Figure 5A:
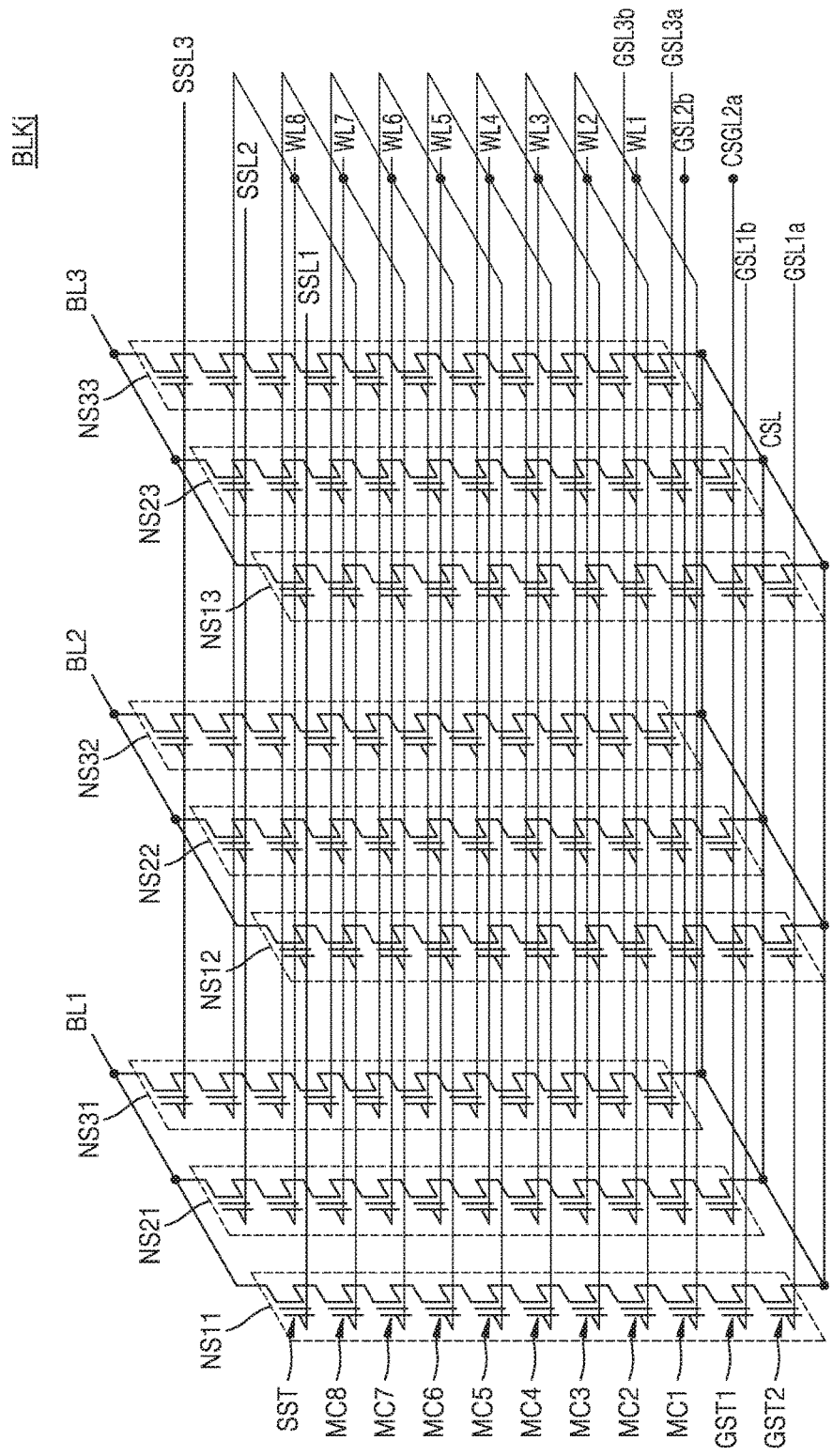
FIGS. 5A and 5B are circuit diagrams illustrating modifications of the circuit of the memory block BLKa of FIG. 2.
Figure 5B:
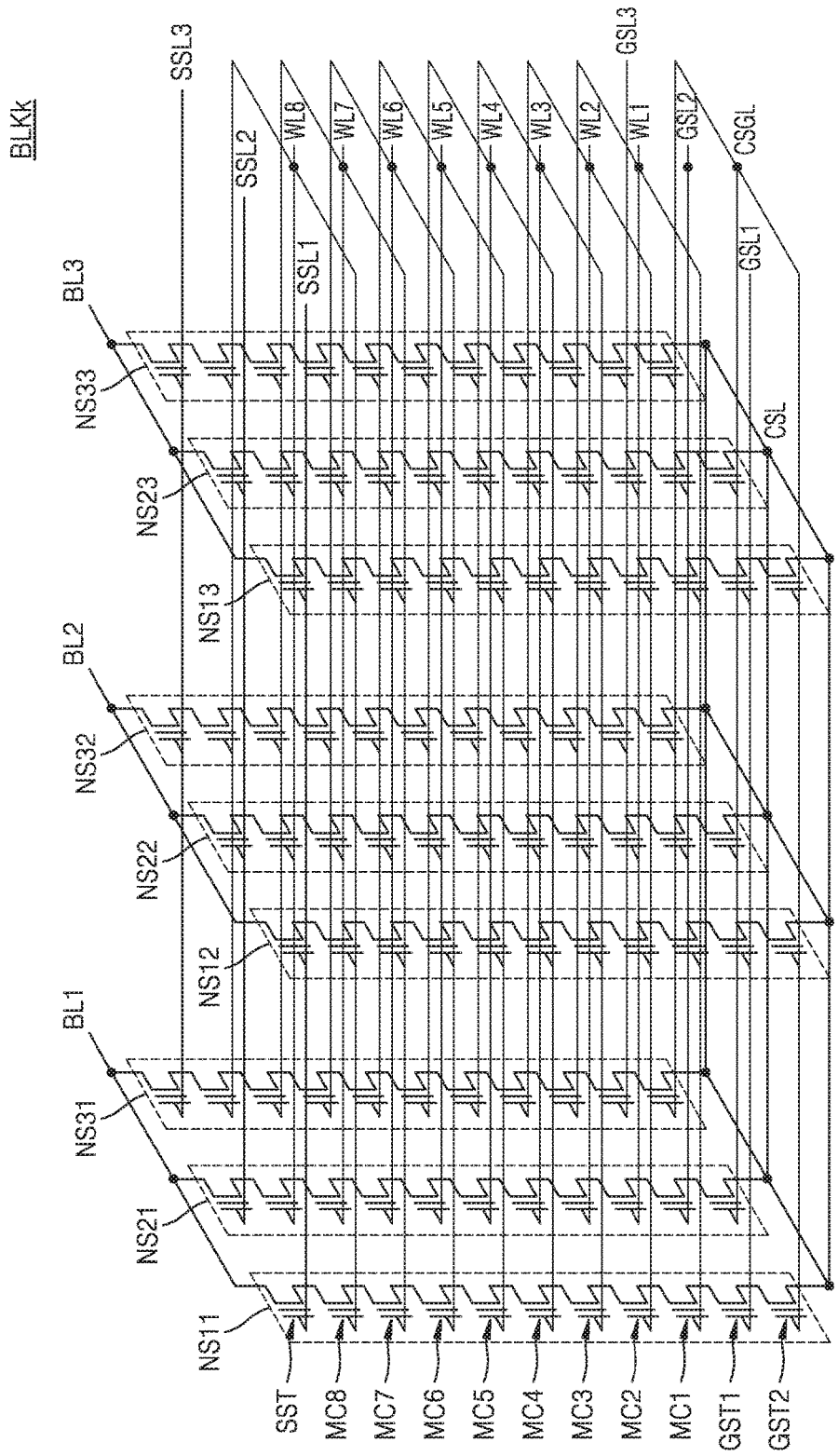

For example, FIG. 5A and FIG. 5B are circuit diagrams illustrating modifications of the circuit of the memory block BLKa of FIGS. 3-4. In some example embodiments of inventive concepts, at least one of the memory blocks BLK1 to BLKz in FIG. 2 may be implemented as the memory block BLKj in FIG. 5A and the memory block BLKk in FIG. 5B. The memory block BLKj in FIG. 5A and the memory block BLKk in FIG. 5B are the same as the memory block BLKa in FIGS. 3-4, except the NAND cell strings (e.g., NSL11 to NSL33) each include a first ground selection transistor GST1 and a second ground selection transistor GST2 instead of a single ground selection transistor GST.

Referring to FIG. 5A, the first ground selection transistor GST1 may be between the memory cells MC1 to MC8 and the second ground selection transistor GST2. The first ground selection transistors GST1 may be connected to first to third ground selection lines GSL1$b$, GSL2$b$, and GSL2$c$. The second ground selection transistors GST2 may be connected to first to third ground selection lines GSL1$a$, GSL2$a$, and GSL3$a$. Even though FIG. 5A illustrates each of the cell strings includes eight memory cells MC1 to MC8, one of ordinary skill in the art would appreciate the number of memory cells in each of the cell strings NS11 to NS33 may be variously changed depending on design considerations.

Referring to FIG. 5B, the first ground selection transistor GST1 may be between the memory cells MC1 to MC8 and the second ground selection transistor GST2. The first ground selection transistors GST1 may be connected to first to third ground selection lines GSL1, GSL2, and GSL2. The second ground selection transistors GST2 may be connected to the common ground selection line CGSL. The first ground selection transistors GST1 operate separately according to the corresponding ground selection line among the first to third ground selection lines GSL1, GSL2 and GSL3, and the second ground selection transistors GST2 can operate in common.

Referring to FIGS. 2-5, the control logic 120 may be configured to control a first weak-on voltage applied to an unselected string selection line among the string selection lines and a second weak-on voltage applied to an unselected ground selection line among the ground selection lines during a setup interval of a sensing operation for sensing data from a selected string among the strings. The selected string and the unselected string may be connected in common to a same bit line. For example, strings NS11 and NS21, which are both connected to bit line BL1, may be the selected string and the unselected string. The unselected string selection line and the unselected ground selection line may be connected to the string selection transistor and the ground selection transistor, respectively, of the same unselected string.

Figure 6:
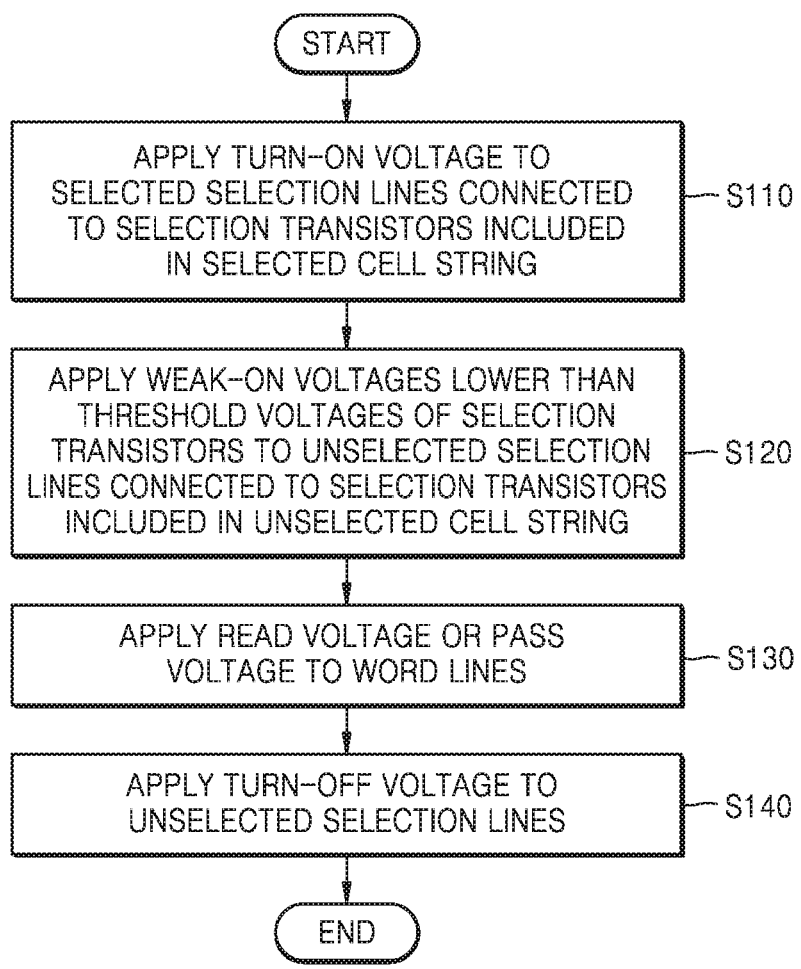
FIG. 6 is a flowchart illustrating a method of operating a memory device according to some example embodiments of inventive concepts.

FIG. 6 is a flowchart illustrating a method of operating a memory device according to some example embodiments of inventive concepts. Specifically, FIG. 6 illustrates a method of reading the memory device, and may include operations performed on the memory device 100 of FIG. 2 in time series or in parallel.

Referring to FIGS. 2 and 6, in S110, the control logic 120 may control the voltage generator 130 and row decoder 140 to apply turn-on voltages to selected selection lines connected to selection transistors included in a selected cell string. The selection transistors include a ground selection transistor and a string selection transistor, and the selection lines include a ground selection line and a string selection line which are connected to the ground selection transistor and the string selection transistor, respectively. The turn-on voltages may be voltages which fully turn-on the ground selection transistor and the string selection transistor, and may be greater than or equal to threshold voltages of the ground selection transistor and the string selection transistor. A level of the turn-on voltage applied to the selected ground selection line may be the same as or different from a level of the turn-on voltage applied to the selected string selection line.

In S120, the control logic 120 may control the voltage generator 130 and row decoder 140 to apply weak-on voltages to unselected selection lines connected to selection transistors included in an unselected cell string. The weak-on voltages may be applied during a setup interval of a sensing operation for sensing data from a selected string. The weak-on voltages are lower than the threshold voltages of the selection transistors of the unselected string. In some example embodiments, the control logic 120 may control the voltage generator 130 and row decoder 140 to apply a first weak-on voltage to an unselected string selection line and to apply a second weak-on voltage to an unselected ground selection line. A level of the first weak-on voltage may be the same as or different from a level of the second weak-on voltage. A time for which the first weak-on voltage is applied (e.g., pulse width) may be the same as or different from a time for which the second weak-on voltage is applied (e.g., pulse width).

In S130, the control logic 120 may control the voltage generator 130 and row decoder 140 to apply a read voltage to a selected word line and a pass voltage to unselected word lines.

In S140, the control logic 120 may control the voltage generator 130 and row decoder 140 to apply a turn-off voltage to the unselected selection lines. The turn-off voltage is a voltage that fully turns off the ground selection transistor and the string selection transistor. For example, the turn-off voltage may be a ground voltage. After the selection transistors included in the unselected cell string are weakly turned-on by applying the weak-on voltages to the unselected selection lines in S120 and then a desired (and/or alternatively predetermined) time has elapsed, the selection transistors may be turned-off by applying the turn-off voltage to the unselected selection lines in S140. The turn-off voltage may be applied to the unselected selection lines before a sensing operation is performed on the memory cells connected to the selected word line.

Meanwhile, the control logic 120 may control the voltage generator 130 and row decoder 140 to apply the turn-on voltage to the selected selection lines during an entire reading interval, and the read voltage or the pass voltage may be applied to the word lines during the entire reading interval. The weak-on voltages may be applied to the unselected selection lines in part of the reading interval, for example, in a read setup interval or, the read setup interval and in part of a sensing interval. Therefore, operations S110, S120, and S130 may be simultaneously performed or may be performed in parallel.

Hereinafter, the method of operating the memory device of FIG. 6 will be described in more detail with reference to FIGS. 7 and 8.

Figure 7:
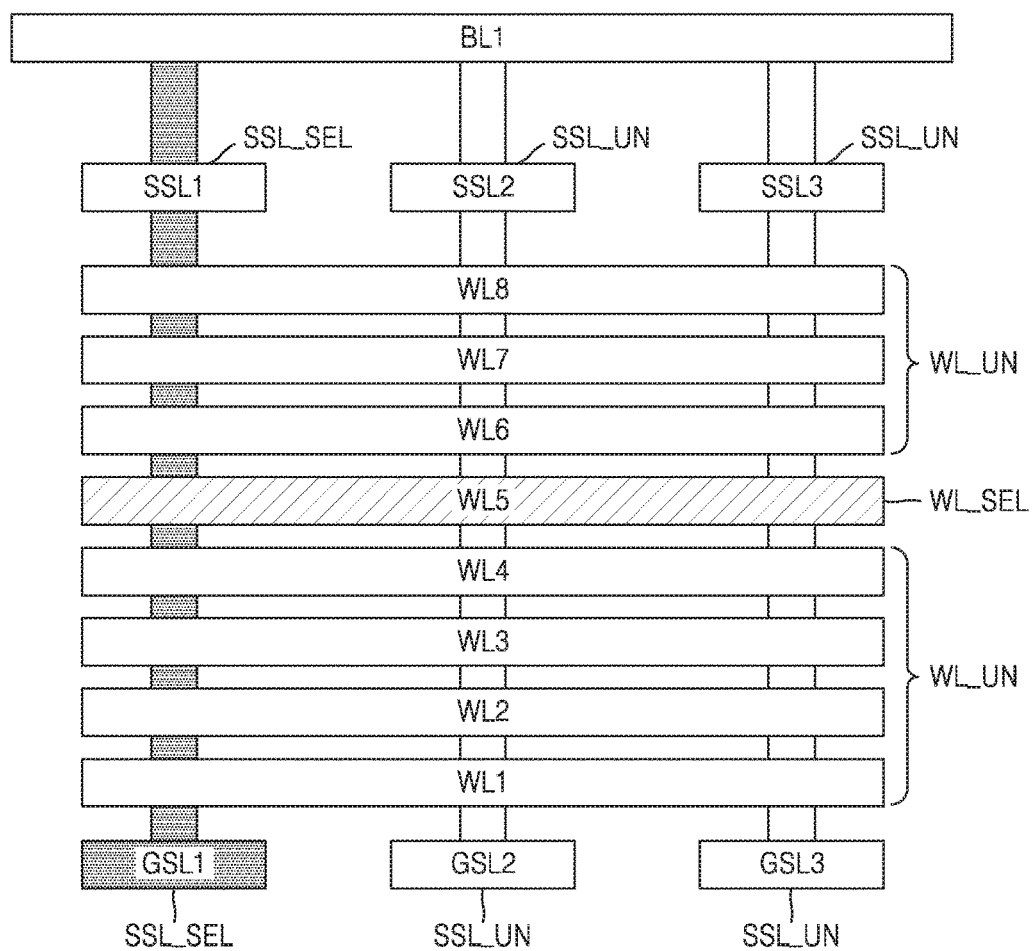
FIG. 7 is a diagram illustrating word lines and selection lines which are connected to a plurality of cell strings which share a single bit line.

FIG. 7 is a diagram illustrating word lines and selection lines which are connected to a plurality of cell strings which share a single bit line. FIG. 8 is a timing diagram according to the method of operating the memory device of FIG. 6.

FIG. 7 illustrates the word lines WL1 to WL8, the string selection lines SSL1, SSL2, and SSL3, and the ground selection lines GSL1, GSL2, and GSL3, which are connected to the cell strings NS11, NS21, and NS31 of the memory block BLKa of FIG. 3. The cell strings NS11, NS21, and NS31 are connected to the first bit line BL1. In FIG. 3, description will be made assuming a case in which a read operation is performed on memory cells which are connected to a fifth word line WL5 and included in the cell strings NS11, NS12, and NS13 constituting the first row.

Referring to FIG. 7, a first string selection line SSL1 is a selected string selection line SSL_SEL, and a second string selection line SSL2 and a third string selection line SSL3 are unselected string selection lines SSL_UN. A first ground selection line SGL1 is a selected ground selection line GSL_SEL, and a second ground selection line GSL2 and a third ground selection line GSL3 are unselected ground selection lines GSL_UN. The fifth word line WL5 is a selected word line WL_SEL, and first to fourth word lines WL1 to WL4 and sixth to eighth word lines WL6 to WL8 are unselected word lines WL_UN.

Figure 8:
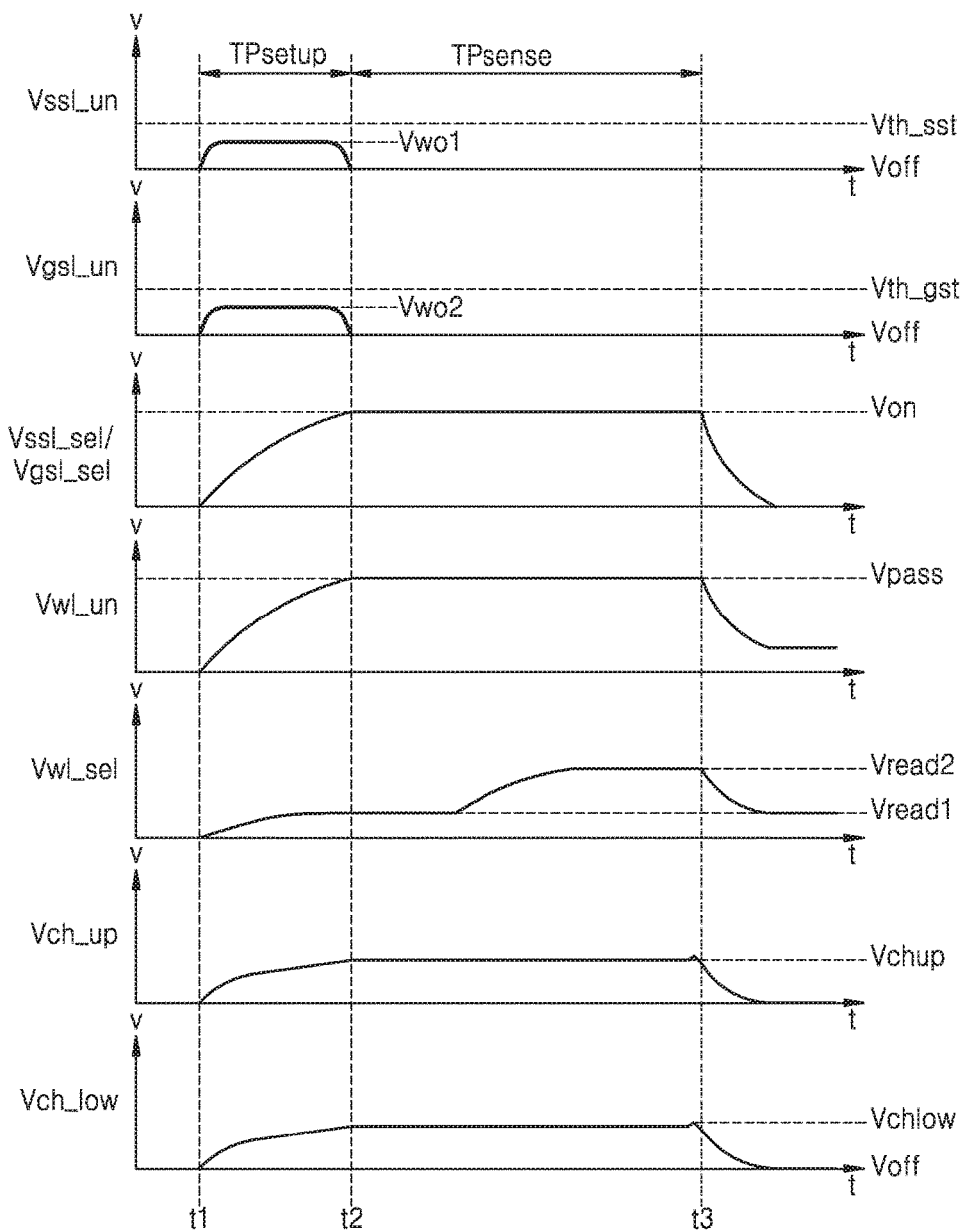
FIG. 8 is a timing diagram according to the method of operating the memory device of FIG. 6.

Referring to FIGS. 2, 7 and 8, corresponding voltages may be respectively applied to the word lines and the selection lines at a time point t1. The control logic 120 may control the voltage generator 130 and row decoder 140 to apply a turn-on voltage Von to the selected string selection line SSL_SEL and the selected ground selection line GSL_SEL. The control logic 120 may control the voltage generator 130 and row decoder 140 to apply a first weak-on voltage Vwo1 to the unselected string selection lines SSL_UN and to apply a second weak-on voltage Vwo2 to the unselected ground selection lines GSL_UN during the read setup interval TPsetup. The control logic 120 may control the voltage generator 130 and row decoder 140 to apply a read voltage, for example first read voltage Vread1 to the selected word line WL_SEL and to apply a pass voltage Vpass to the unselected word lines WL_UN. In some example embodiments, the turn-on voltage Von may be the same as the pass voltage Vpass.

Meanwhile, the first weak-on voltage Vwo1 is greater than a ground voltage and lower than a threshold voltage Vth_sst of the string selection transistor SST (see FIG. 3) (hereinafter referred to as a first threshold voltage). The second weak-on voltage Vwo2 is greater than a ground voltage and lower than a threshold voltage Vth_gst of the ground selection transistor GST (see FIG. 3) (hereinafter referred to as a second threshold voltage). For example, the first weak-on voltage Vwo1 may be lower than the first threshold voltage Vth_sst by as much as about 1V (volt). The second weak-on voltage Vwo2 may be lower than the second threshold voltage Vth_gst by as much as about 1V (volt). However, inventive concepts are not limited thereto, and respective differences between the weak-on voltages Vwo1 and Vwo2 and the threshold voltages Vth_sst and Vth_gst may be variously set.

The first weak-on voltage Vwo1 and the second weak-on voltage Vwo2 may be the same or different according to a level of the first threshold voltage Vth_sst and a level of the second threshold voltage Vth_gst. Further, the first weak-on voltage Vwo1 and the second weak-on voltage Vwo2 may be preset, and may vary according to a temperature, an address, a program pattern, and the like. The control logic 120 may be configured to control the first weak-on voltage Vwo1 and the second weak-on voltage Vwo2 to have a same level during the setup interval TPsetup, but inventive concepts are not limited thereto.

At a time point t2, voltage levels of the selected string selection line SSL_SEL and the selected ground selection line GSL_SEL may reach the turn-on voltage Von. Further, levels of voltages Vwl_un of the unselected word lines WL_UN may reach the pass voltage Vpass. The time interval from the time point t1 to the time point t2 is the read setup interval TPsetup. In the read setup interval TPsetup, the voltages of the selection lines and the word lines of the selected cell string may be setup to desired levels. At the time point t2 or after the time point t2, a turn-off voltage Voff may be applied to the unselected string selection lines SSL_UN and the unselected ground selection lines GSL_UN. For example, the turn-off voltage Voff may be a ground voltage. During the sensing interval TPsense, the turn-off voltage Voff may be applied to the unselected string selection lines SSL_UN and the unselected ground selection lines GSL_UN to begin at the same time (e.g., t2). Alternatively, although not shown in FIG. 8, the turn-off voltage Voff may be applied to the unselected string selection lines SSL_UN and the unselected ground selection lines GSL_UN to begin at different times (see e.g., FIG. 14B, Voff is applied to the SSL_UN at t2 and the GSL_UN at t3). A time interval from the time point t2 to a time point t3 is the sensing interval TPsense. In the sensing interval TPsense, the selected memory cells may be sensed and data may be read based on the read voltage applied to the selected word line WL_SEL, for example, the first read voltage Vread1 and the second read voltage Vread2. Meanwhile, in FIG. 8, the first read voltage Vread1 and the second read voltage Vread2 are illustrated as being sequentially applied to the selected word line WL_SEL, but inventive concepts are not limited thereto. For example, when the memory cell connected to the selected word line WL_SEL is a single-level cell, a single read voltage, that is, the first read voltage Vread1, may be applied. When the memory cell connected to the selected word line WL_SEL is a multi-level cell or a triple-level cell, a plurality of read voltages for identifying resistance distributions corresponding to data may be sequentially applied as illustrated FIG. 8, and a resistance of the memory cell with respect to each of the read voltages may be sensed.

In this manner, according to some example embodiments of inventive concepts, the first weak-on voltage Vwo1 and the second weak-on voltage Vwo2 may be applied to the unselected string selection lines SSL_UN and the unselected ground selection lines GSL_UN, respectively, during the read setup interval TPsetup or during the read setup interval TPsetup and part of the sensing interval TPsense. In other words, a pre-pulse having a level lower than those of the first threshold voltage Vth_sst and the second threshold voltage Vth_gst may be applied to the unselected string selection lines SSL_UN and the unselected ground selection lines GSL_UN.

A voltage of a channel of the unselected cell string may be boosted by the pass voltage Vpass applied to the unselected word lines WL_UN. According to some example embodiments of inventive concepts, the string selection transistor SST and the ground selection transistor GST of the cell string may be weakly turned-on during a desired (and/or alternatively predetermined) interval, for example, during the read setup interval TPsetup, a leakage current flows through the string selection transistor SST and the ground selection transistor GST of the cell string, and thus the channel potential of the unselected cell string may be slowly boosted. As illustrated in FIG. 8, an upper channel potential Vch_up and a lower channel potential Vch_low are slowly increased during the read setup interval TPsetup. In this case, the upper channel potential Vch_up refers to a boosting potential in an area of a channel closer (e.g., adjacent) to the string selection transistor SST, and the lower channel potential Vch_low refers to a boosting potential in an area of a channel closer (e.g., adjacent) to the ground selection transistor GST. Referring to FIG. 7, the upper channel potential Vch_up refers to a boosting potential in an area of a channel corresponding to the sixth to eighth word lines WL6 to WL8, and the lower channel potential Vch_up refers to a boosting potential in an area of a channel corresponding to the first to fourth word lines WL1 to WL4. The upper channel potential Vch_up and the lower channel potential Vch_low may be increased up to a first channel boosting level Vchup and a second channel boosting level Vchlow, and the first channel boosting level Vchup and the second channel boosting level Vchlow may be the same as or similar to each other.

In some example embodiment of inventive concepts, the voltages in the diagrams of FIGS. 7-8 may be applied to the circuit diagram in FIG. 5A of the present application, except the ground selection lines connected to the first and second ground selection transistors GST1 and GST2 of the selected string may correspond to the selected ground selection line GSL_SEL and the ground selection lines connected to the first and ground selection transistors GST1 and GST2 of the unselected string(s) may correspond to the unselected ground selection line GSL_UN.

In other words, referring to FIGS. 5A and 8, during the read setup interval TPsetup, the control logic 120 may control the voltage generator 130 and row decoder 140 such that a voltage applied to the selected ground selection line GSL_SEL (e.g., first ground selection lines GSL1a and GSL1b of FIG. 5A) increases to a turn-on voltage Von, and the second weak-on voltage Vwo2 is applied to the unselected ground selection lines GSL_UN (e.g., second and third ground selection lines GSL2a, GSL2b, GSL3a, and GSL3b of FIG. 5A). During the sensing interval TPsense, the control logic 120 may control the voltage generator 130 and row decoder 140 to apply the turn-on voltage Von to the selected ground selection line GSL_SEL (e.g., first ground selection lines GSL1a and GSL1b) and to apply the turn-off voltage Voff to the unselected ground selection lines GSL_UN (e.g., second and third ground selection lines GSL2a, GSL2b, GSL3a, and GSL3b of FIG. 5A).

Alternatively, in some example embodiments, referring to FIGS. 5A and 8, the ground selection lines connected to the second ground selection transistor GST2 of the unselected string(s) (e.g., GSL2a and GSL3a of FIG. 5A) may receive a voltage that is different than the second weak-on voltage Vwo2, such as a turn off voltage Voff, during the read setup interval TPsetup of the reading operation.

In some example embodiment of inventive concepts, the voltages in the diagrams of FIGS. 7-8 may be applied to the circuit diagram in FIG. 5B of the present application, except the first ground selection line GSL1 connected to the first ground selection transistor GST1 of the selected first cell string NS11 may correspond to the selected ground selection line GSL_SEL and the second and third ground selection lines GSL2 and GSL3 connected to the first ground selection transistor GST1 of the unselected second and third cell strings NS21 and NS31 may correspond to unselected ground selection line GSL_UN. The common ground selection line CGSL connected to the second ground selection transistors GST2 of the first to third cell strings NS11, NS21, and NS31 may correspond to the selected ground selection line GSL_SEL.

In other words, referring to FIGS. 5B and 8, during the read setup interval TPsetup, the control logic 120 may control the voltage generator 130 and row decoder 140 such that a voltage applied to the selected ground selection line GSL_SEL (e.g., first ground selection line GSL1 and common ground selection line CGSL of FIG. 5B) increases to a turn-on voltage Von, and the second weak-on voltage Vwo2 is applied to the unselected ground selection lines GSL_UN (e.g., second and third ground selection lines GSL2, and GSL3 of FIG. 5B). During the sensing interval TPsense, the control logic 120 may control the voltage generator 130 and row decoder 140 to apply the turn-on voltage Von to the selected ground selection line GSL_SEL (e.g., first ground selection line GSL1 and common ground selection line CGSL) and to apply the turn-off voltage Voff to the unselected ground selection lines GSL_UN (e.g., second and third ground selection lines GSL2, and GSL3 of FIG. 5B).

Therefore, during the read setup interval TPsetup and the sensing interval TPsense, the turn-on voltage Von may be applied to the second ground selection transistor GST2 of the first to third cell strings NS11, NS21, and NS23 and the turn-on voltage Von may be applied to the first ground selection transistor GST1 of the selected first cell string NS11. The second weak-on voltage Wwo2 may be applied to the first ground selection transistor GST1 of the unselected second and third cell stems NS12 and NS13. The second weak-on voltage Wwo2 may be equal to or different from the first weak-on voltage Vwo1

Figure 9:
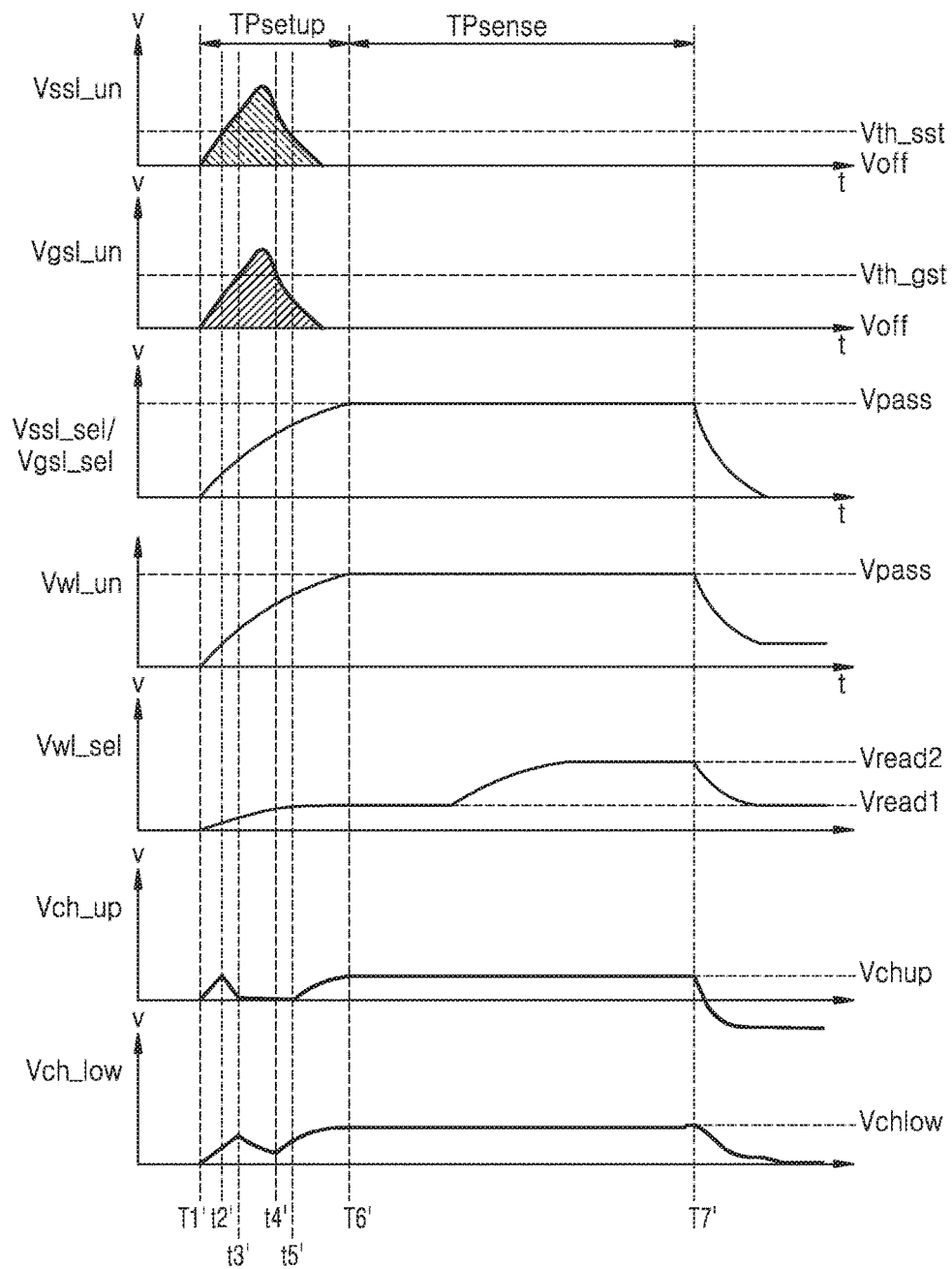
FIG. 9 is a timing diagram according to a comparative example of the method of operating the memory device.

FIG. 9 is a timing diagram according to a comparative example of the method of operating the memory device.

Referring to FIG. 9, a pre-pulse having a level higher than those of the threshold voltages Vth_sst and Vth_gst may be applied to the unselected string selection lines and the unselected ground selection lines during part of the read setup interval TPsetup. Thus, the string selection transistor SST of the unselected cell string may be turned-on from a second time point T2' to a fifth time point T5' and may be turned-off after the fifth time point T5'. The ground selection transistor GST may be turned-on from a third time point T3' to a fourth time point T4' and may be turned-off after the fourth time point T4'. When the string selection transistor SST and the ground selection transistor GST of the unselected cell string are turned-on, a boosting charge of the channel of the unselected cell string may be rapidly discharged, and thus, the boosting potential of the channel may be rapidly reduced. When the string selection transistor SST and the ground selection transistor GST of the unselected cell string are turned-off, a boosting potential of the channel of the unselected cell string may be rapidly increased. In this manner, HCI may be caused by the rapid change of the boosting potential of the channel. Further, a difference between the upper channel potential Vch_up and the lower channel potential Vch_low may be caused by the levels of the threshold voltages of the string selection transistor SST and the ground selection transistor GST, a position of the selected word line WL_SEL, a program pattern, and the like. In other words, the boosting potential in the channel may become uneven.

However, as described above with reference to FIG. 8, according to some example embodiments of inventive concepts, when a read operation is performed, as the weak-on voltages lower than the threshold voltages of the selection transistors are applied to the unselected selection lines, in other words, a pre-pulse which weakly turns-on the selection transistors is applied for a desired (and/or alternatively predetermined) time, the channel potential of the unselected cell string may be slowly boosted to an appropriate level, HCI may not occur, and the boosting potential in the channel may become even.

Figure 10:
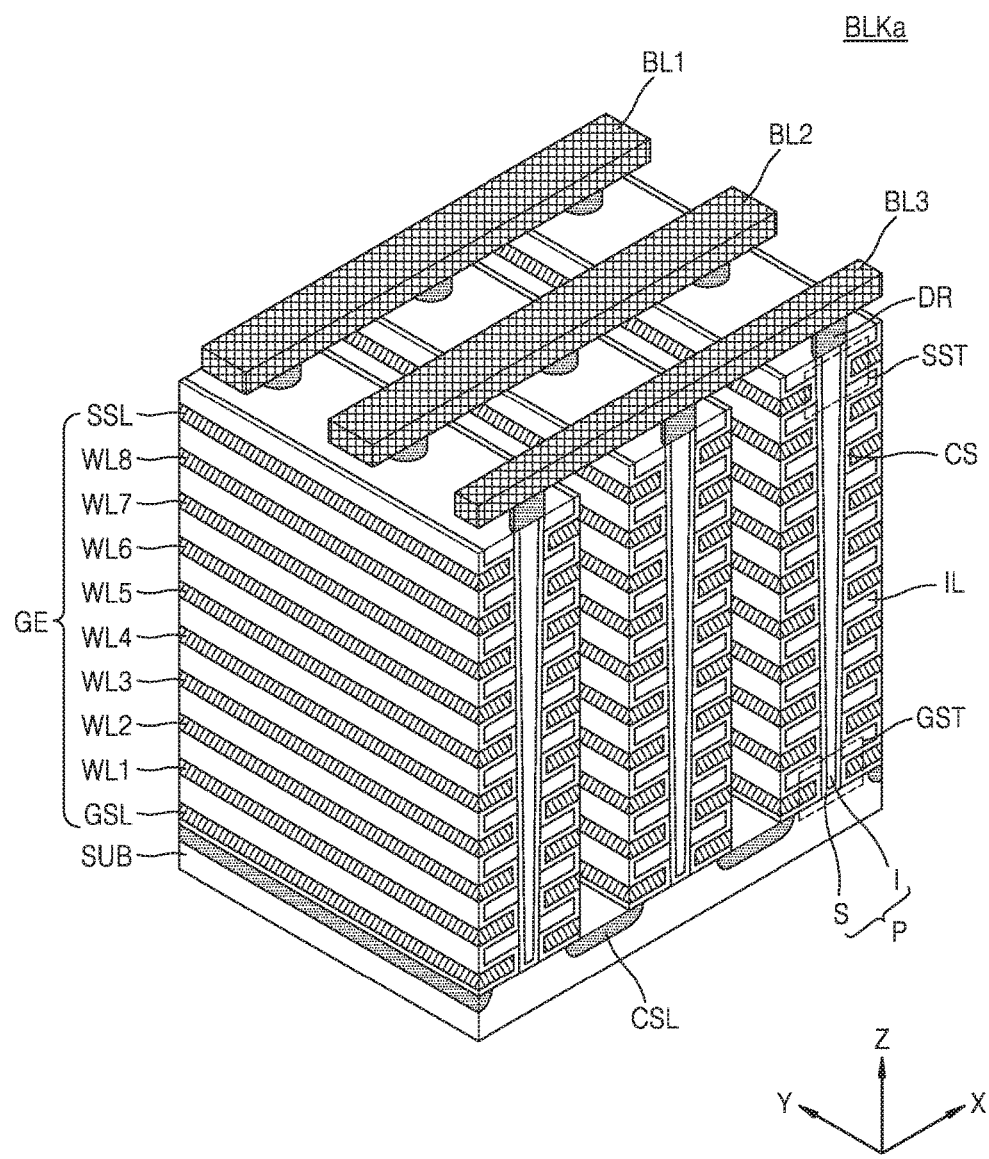
FIG. 10 is a perspective view illustrating the memory block of FIG. 3.

FIG. 10 is a perspective view illustrating the memory block of FIG. 3.

Referring to FIG. 10, the memory block BLKa is formed in a direction perpendicular to a substrate SUB. In FIG. 10, although the memory block BLKa is illustrated as including two selection lines GSL and SSL, eight word lines WL1 to WL8, and 3 three bit lines BL1 to BL3, the memory block BLKa may actually include more or less components than that.

The substrate SUB has a first conductive type (e.g., a P type), and a common source line CSL, which extends in a first direction (e.g., a Y direction), is doped with impurities having a second conductive type (e.g., an N type) and is provided on the substrate SUB. A plurality of insulating layers IL which extend in the first direction are sequentially provided on an area of the substrate SUB between two adjacent common source lines CSL in a third direction (e.g., a Z direction), and the plurality of insulating layers IL are spaced a desired (and/or alternatively predetermined) distance from each other in the third direction. For example, the plurality of insulating layers IL may include an insulating material such as silicon oxide.

A plurality of pillars P which are sequentially disposed in the first direction and pass through the plurality of insulating layers IL in the third direction are provided on the area of the substrate SUB between the two adjacent common source lines CSL. For example, the plurality of pillars P may pass through the plurality of insulating layers IL to come into contact with the substrate SUB. Specifically, a surface layer S of each of the pillars P may include a silicon material having the first conductive type and serve as a channel area. Meanwhile, an inner layer I of each of the pillars P may include an insulating material such as silicon oxide or an air gap.

In the area between the two adjacent common source lines CSLs, a charge storage layer CS is provided along exposed surfaces of the insulating layers IL, the pillars P, and the substrate SUB. The charge storage layer CS may include a gate insulating layer (which may be referred to as 'a tunnel insulating layer'), a charge trapping layer, and a blocking insulating layer. For example, the charge storage layer CS may have an oxide-nitride-oxide (ONO) structure. Further, in the area between the two adjacent common source lines CSLs, gate electrodes GE such as the selection lines GSL and SSL and the word lines WL1 to WL8 are provided on an exposed surface of the charge storage layer CS.

Drains or drain contacts DR are respectively provided on the plurality of pillars P. For example, the drains or the drain contacts DR may include a silicon material doped with impurities having the second conductive type. The bit lines BL1 to BL3, which extend in a second direction (e.g., an X direction) and are spaced a desired (and/or alternatively predetermined) distance from each other in the first direction, are provided on the drain contacts DR Meanwhile, the threshold voltages of the ground selection transistor GST and the string selection transistor SST which are included in the memory block BLKa illustrated in FIG. 10 may be different from each other as illustrated in FIG. 11.

Figure 11:
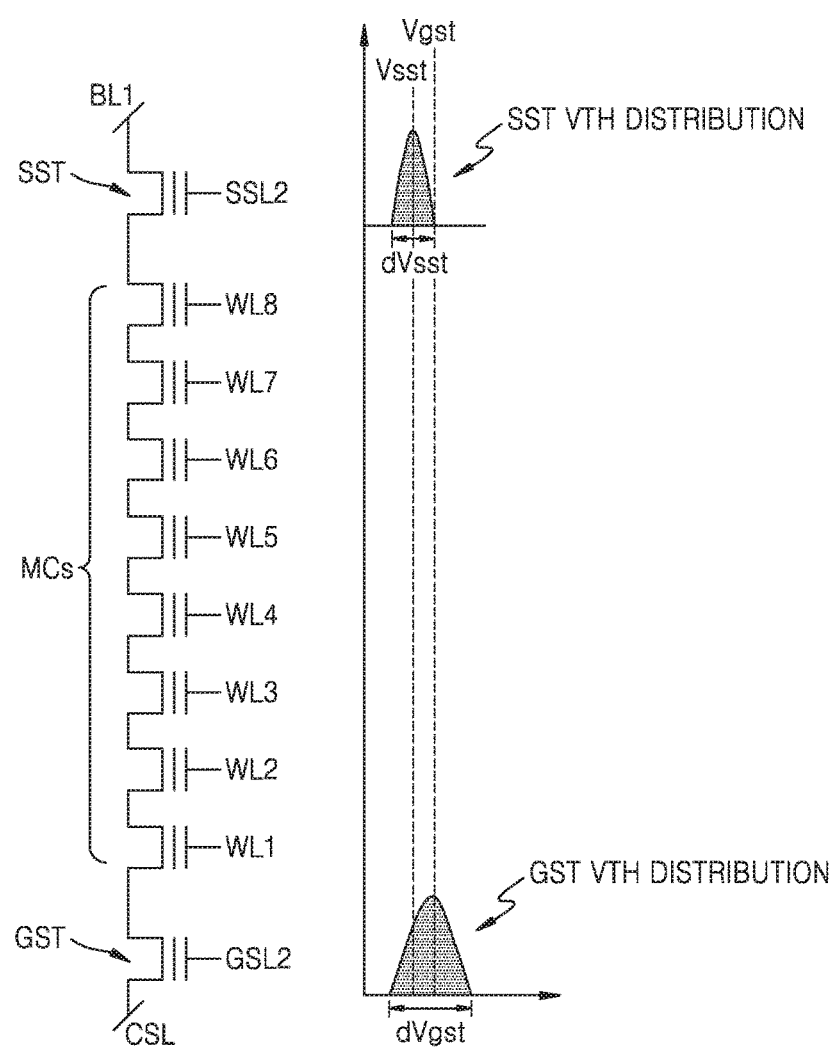
FIG. 11 is a diagram illustrating threshold voltage distributions of a ground selection transistor and a string selection transistor.

FIG. 11 is a diagram illustrating threshold voltage distributions of the ground selection transistor GST and the string selection transistor SST. Referring to FIG. 11, a threshold voltage distribution dVsst of the string selection transistor SST may be smaller than a threshold voltage distribution dVgst of the ground selection transistor GST.

A difference between the threshold voltage distribution dVsst of the string selection transistor SST and the threshold voltage distribution dVgst of the ground selection transistor GST may result from a structural difference between the string selection transistor SST connected to the string selection line SSL and the ground selection transistor GST connected to the ground selection line GSL. Referring to FIG. 10, the ground selection transistor GST is in contact with the substrate SUB, and thus may have a threshold voltage distribution different from that of the string selection transistor SST closer (e.g., adjacent) to the bit line BL. Further, the string selection transistor SST is selectively programed by selected/unselected levels of the bit line BL, and the threshold voltage distribution dVsst may be formed to be small, and since the ground selection transistor GST is commonly connected to the common source line CSL and the threshold voltage distribution thereof is formed by a one-shot program rather than a selective program, the threshold voltage distribution dVgst may be formed to be large.

Thus, as illustrated in FIG. 11, the threshold voltage distribution dVgst of the ground selection transistor GST may be relatively wide, and the threshold voltage distribution dVsst of the string selection transistor SST may be relatively narrow. Further, a central level Vgst of the threshold voltage of the ground selection transistor GST may be higher than a central level Vsst of the threshold voltage of the string selection transistor SST.

Therefore, the threshold voltage of the string selection transistor SST, that is, the first threshold voltage Vth_sst, may be different from the threshold voltage of the ground selection transistor GST, that is, the second threshold voltage Vth_gst, due to procedural and structural reasons. Referring to FIG. 5A and FIG. 5B, in the memory block BLKj and the memory block BLKk, the second ground selection transistor GST2 may have a threshold distribution that is similar to the threshold voltage distribution dVgst in FIG. 11 because the second ground selection transistor GST2 is commonly connected to the common source line CSL. The first ground selection transistor GST1 in the memory block BLKj and the memory BLKk are selectively programed by selected/unselected levels of the bit line BL, and a threshold voltage distribution of the first ground selection transistor GST1 may be formed to be smaller than the threshold voltage distribution dVgst in FIG. 11. For example, the first ground selection transistor GST1 in the memory block BLKj and the memory BLKk may have a threshold voltage distribution that is similar to the threshold voltage distribution dVsst in FIG. 11.

Figure 12A:
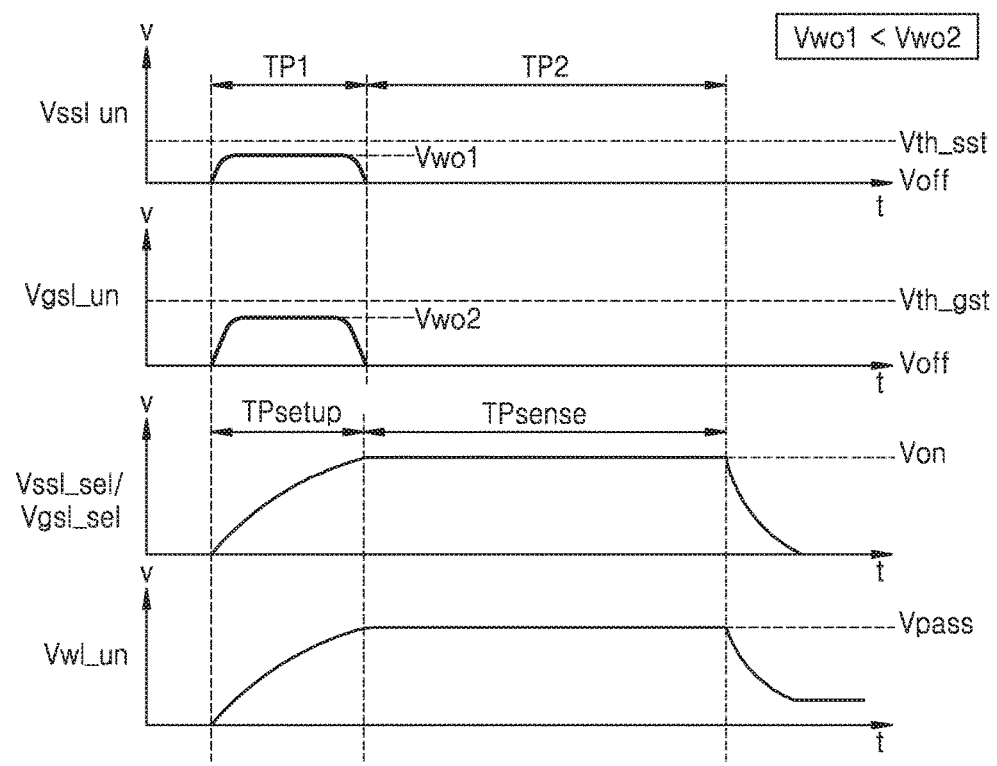
FIGS. 12A and 12B are timing diagrams illustrating waveforms of voltages applied to unselected selection lines according to some example embodiments of inventive concepts.
Figure 12B:
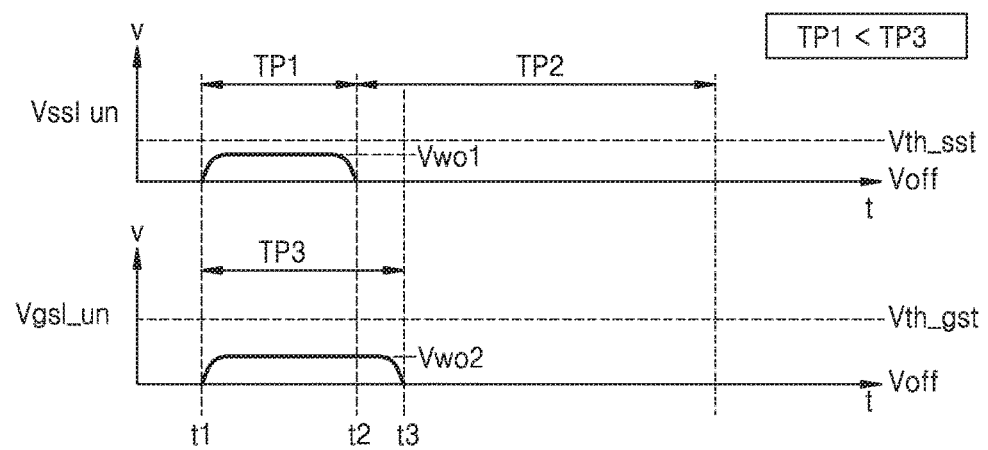

FIGS. 12A and 12B are timing diagrams illustrating waveforms of voltages applied to unselected selection lines according to some example embodiments of inventive concepts.

As described above with reference to FIGS. 10 and 11, a level of the threshold voltage of the string selection transistor SST, that is, a level of the first threshold voltage Vth_sst, may be different from a level of the threshold voltage of the ground selection transistor GST, that is, a level of the second threshold voltage Vth_gst. In order to compensate for a difference between the threshold voltages, a level of the first weak-on voltage Vwo1 may be set to be different from a level of the second weak-on voltage Vwo2 as illustrated in FIG. 12A. In other words, a level of the pre-pulse applied to the unselected string selection lines SSL_UN may be different from a level of the pre-pulse applied to the unselected ground selection lines GSL_UN according to the levels of the threshold voltages.

Referring to FIG. 12A, the weak-on voltages Vwo1 and Vwo2 may be applied to the unselected selection lines, that is, the unselected string selection lines SSL_UN and the unselected ground selection lines GSL_UN, in a first interval TP1. The first interval TP1 may be the same as or greater than the read setup interval TPsetup. The turn-off voltage Voff may be applied to the unselected selection lines in a second interval TP2.

In FIG. 12A, the first threshold voltage Vth_sst is lower than the second threshold voltage Vth_gst. The control logic 120 may control the voltage generator 130 and the row decoder 140 so the levels of the weak-on voltages Vwo1 and Vwo2 may be set or adjusted according to the levels of the corresponding threshold voltages. Therefore, the level of the first weak-on voltage Vwo1 may be lower than the level of the second weak-on voltage Vwo2. Alternatively, although not illustrated in FIG. 12A, if the first threshold voltage Vth_sst is higher than the second threshold voltage Vth_gst, the control logic 120 may control the voltage generator 130 and row decoder 140 so the level of the first weak-on voltage Vwo1 is set higher than the level of the second weak-on voltage Vwo2.

Further, in order to compensate for the difference between the threshold voltages, the control logic 120 may control the voltage generator 130 and the row decoder 140 so a time for which the first weak-on voltage Vwo1 is applied may be set to be different from a time for which the second weak-on voltage Vwo2 is applied as illustrated in FIG. 12B. In other words, a width of the pre-pulse applied to the unselected string selection lines SSL_UN may be different from the width of the pre-pulse applied to the unselected ground selection lines GSL_UN according to the levels of the threshold voltages.

In FIG. 12B, the first weak-on voltage Vwo1 may be applied to the unselected string selection lines SSL_UN during the first interval TP1, and the second weak-on voltage Vwo2 may be applied to the unselected ground selection lines GSL_UN during a third interval TP3 that is different than the first interval TP1. As shown in FIG. 12B, in a case where the second threshold voltage Vth_gst is greater than the first threshold voltage Vth_sst, the control logic 120 may control the voltage generator 130 and row decoder 140 so a length of the third interval TP3 is greater than a length of the first interval TP1. In this case, the level of the first weak-on voltage Vwo1 may be the same as the level of the second weak-on voltage Vwo2. However, inventive concepts are not limited thereto, and the level and application time of the first weak-on voltage Vwo1 may be different from the level and application time of the second weak-on voltage Vwo2. Alternatively, if the first threshold voltage Vth_sst is higher than the second threshold voltage Vth_gst, the control logic 120 may control the voltage generator 130 and row decoder 140 so the length of the first interval TP1 in FIG. 12B is greater than the length of the third interval TP3 in FIG. 12B.

In some example embodiment of inventive concepts, the voltages in the diagrams of FIGS. 12A and 12B may be applied to the circuit diagram in FIG. 5A of the present application, except the ground selection lines connected to the first and second ground selection transistors GST1 and GST2 of the selected string may correspond to the selected ground selection line GSL_SEL and the ground selection lines connected to the first ground selection transistor GST1 and the second ground selection transistor GST2 of the unselected string(s) may correspond to the unselected ground selection line GSL_UN.

In other words, referring to FIGS. 5A and 12A, during the read setup interval TPsetup, the control logic 120 may control the voltage generator 130 and row decoder 140 such that a voltage applied to the selected ground selection line GSL_SEL (e.g., first ground selection lines GSL1a and GSL1b of FIG. 5A) increases to a turn-on voltage Von, and the second weak-on voltage Vwo2 is applied to the unselected ground selection lines GSL_UN (e.g., second and third ground selection lines GSL2a, GSL2b, GSL3a, and GSL3b of FIG. 5A). During the sensing interval TPsense, the control logic 120 may control the voltage generator 130 and row decoder 140 to apply the turn-on voltage Von to the selected ground selection line GSL_SEL (e.g., first ground selection lines GSL1a and GSL1b) and to apply the turn-off voltage Voff to the unselected ground selection lines GSL_UN (e.g., second and third ground selection lines GSL2a, GSL2b, GSL3a, and GSL3b of FIG. 5A). Alternatively, in some example embodiments, referring to FIGS. 5A and 12A, the ground selection lines connected to the second ground selection transistor GST2 of the unselected string(s) (e.g., GSL2a and GSL3a of FIG. 5A) may receive a voltage that is different than the second weak-on voltage Vwo2, such as a turn off voltage Voff, during the read setup interval TPsetup of the reading operation.

Referring to FIGS. 5A and 12B, the control logic 120 may control the voltage generator 130 and row decoder 140 so the second weak-on voltage Vwo2 is applied to the unselected ground selection lines GSL_UN (e.g., second and third ground selection lines GSL2a, GSL2b, GSL3a, and GSL3b of FIG. 5A) during the third interval TP3 from t1 to t3, and the turn-off voltage Voff is applied to the unselected ground selection lines GSL_UN (e.g., second and third ground selection lines GSL2a, GSL2b, GSL3a, and GSL3b of FIG. 5A) after t3. Alternatively, in some example embodiments, referring to FIGS. 5A and 12B, the ground selection lines connected to the second ground selection transistor GST2 of the unselected string(s) (e.g., GSL2a and GSL3a of FIG. 5A) may receive a voltage that is different than the second weak-on voltage Vwo2, such as a turn off voltage Voff, during the third interval TP3 of the reading operation.

In some example embodiment of inventive concepts, the voltages in the diagrams of FIGS. 12A and 12B may be applied to the circuit diagram in FIG. 5B of the present application, except the ground selection line connected to the first ground selection transistor GST1 of the selected cell string and common ground selection line commonly connected to the second ground selection transistors GST2 may correspond to the selected ground selection line GSL_SEL and the ground selection lines connected to the first ground selection transistor GST1 of the unselected cell string(s) may correspond to the unselected ground selection line GSL_UN.

In other words, referring to FIGS. 5B and 12A, during the read setup interval TPsetup, the control logic 120 may control the voltage generator 130 and row decoder 140 such that a voltage applied to the selected ground selection line GSL_SEL (e.g., first ground selection line GSL1 of FIG. 5B) increases to a turn-on voltage Von, and the second weak-on voltage Vwo2 is applied to the unselected ground selection lines GSL_UN (e.g., second and third ground selection lines GSL2 and GSL3 and common ground selection line CGSL of FIG. 5B). During the sensing interval TPsense, the control logic 120 may control the voltage generator 130 and row decoder 140 to apply the turn-on voltage Von to the selected ground selection line GSL_SEL (e.g., first ground selection line GSL1 of FIG. 5B) and to apply the turn-off voltage Voff to the unselected ground selection lines GSL_UN (e.g., second and third ground selection lines GSL2 and GSL3 of FIG. 5B).

Referring to FIGS. 5B and 12B, the control logic 120 may control the voltage generator 130 and row decoder 140 so the second weak-on voltage Vwo2 is applied to the unselected ground selection lines GSL_UN (e.g., second and third ground selection lines GSL2 of FIG. 5B) during the third interval TP3 from t1 to t3, and the turn-off voltage Voff is applied to the unselected ground selection lines GSL_UN (e.g., second and third ground selection lines GSL2 and GSL3 of FIG. 5B) after t3. In some example embodiments, referring to FIGS. 5B, 12A and 12B, the level of the first weak-on voltage Vwo1 may be similar to the level of the second weak-on voltage Vwo2. In addition, the length of the first section TP1 may be similar to the length of the third section TP3. As described above, in the circuit diagram of the memory block BLKj of FIG. 5A, the threshold voltage distribution of the first ground selection transistor GST1 may be similar to the threshold voltage distribution of the string selection transistor SST. Therefore, since the first threshold voltage Vth_sst may be similar to the second threshold voltage Vth_gst, the level of the first weak-on voltage Vwo1 is similar to the level of the second weak-on voltage Vwo2, The length of the first section TP1 may be similar to the length of the third section TP3.

Figure 13:
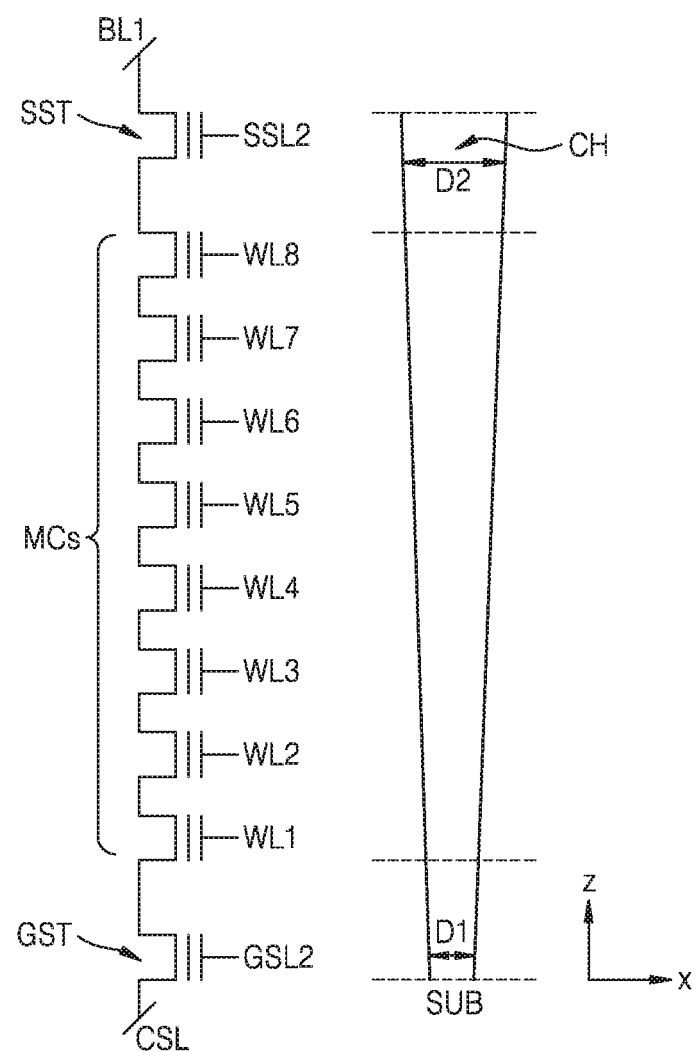
FIG. 13 is a diagram illustrating a channel hole of a single cell string of the memory block of FIG. 3.

FIG. 13 is a diagram illustrating a channel hole of the cell string of the memory block of FIG. 3.

The pillars P (see FIG. 10) may be formed in a channel hole CH formed by etching a mould formed by stacking of the selection lines GSL2 and SSL2 and the word lines WL1 to WL8.

Referring to FIG. 13, as a channel hole CH approaches the substrate SUB, a diameter of the channel hole CH may be reduced. Thus, a size D2 of the channel hole CH of the string selection transistor SST may be greater than a size D1 of the channel hole CH in the vicinity of the ground selection transistor GST. This is because the channel hole CH is formed by etching the channel hole CH from an upper portion of a mould in a direction of the substrate SUB. Since the size D2 of the channel hole CH at a position corresponding to the string selection transistor SST is greater than the size D1 of the channel hole CH at a position corresponding to the ground selection transistor GST, a channel width of the string selection transistor SST may be greater than a channel width of the ground selection transistor GST. In other words, a size of the string selection transistor SST may be greater than a size of the ground selection transistor GST. Thus, when the string selection transistor SST and the ground selection transistor GST are weakly turned-on, resistance of the string selection transistor SST may be smaller than resistance of the ground selection transistor GST. In other words, an amount of current flowing through the string selection transistor SST may be greater than an amount of current flowing through the ground selection transistor GST.

Figure 14A:
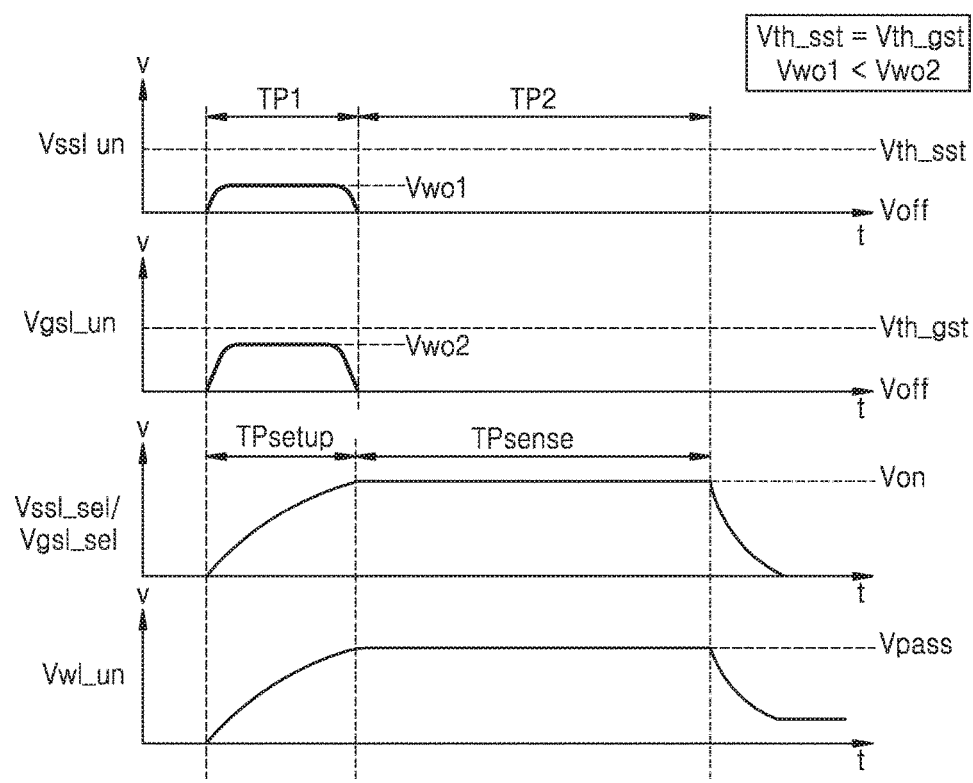
FIGS. 14A and 14B are timing diagrams illustrating waveforms of voltages applied to unselected selection lines according to some example embodiments of inventive concepts.
Figure 14B:
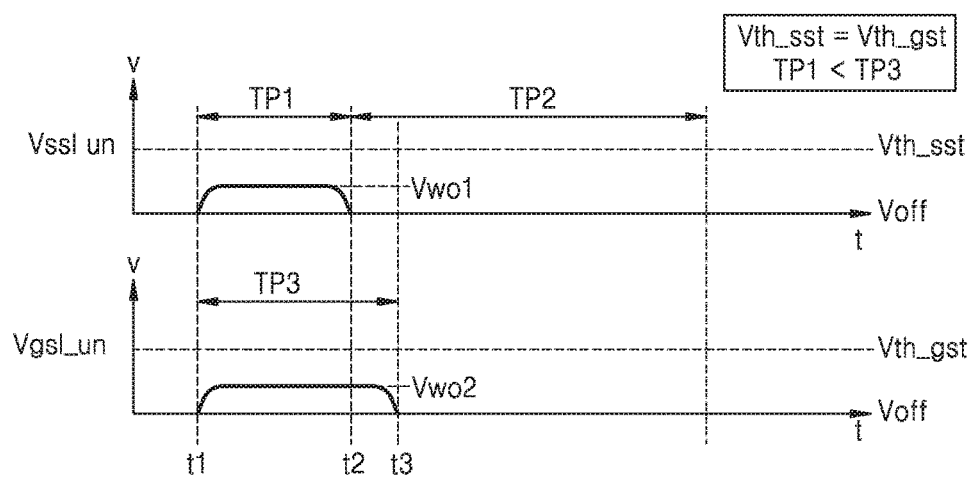

FIGS. 14A and 14B are timing diagrams illustrating waveforms of voltages applied to unselected selection lines according to some example embodiments of inventive concepts.

In order to uniform a channel boosting potential of an unselected cell string by compensating for a difference between the resistance of the string selection transistor SST and the resistance of the ground selection transistor GST, as illustrated in FIGS. 14A and 14B, the level of the first weak-on voltage Vwo1 may be set to be different from the level of the second weak-on voltage Vwo2. When it is assumed that the first threshold voltage Vth_sst is the same as the second threshold voltage Vth_gst, the control logic 120 may control the voltage generator 130 and row decoder 140 so level of the first weak-on voltage Vwo1 is lower than the level of the second weak-on voltage Vwo2.

In order to compensate for the difference between the resistance of the string selection transistor SST and the resistance of the ground selection transistor GST, as illustrated in FIG. 14B, the time for which the first weak-on voltage Vwo1 is applied may be set to be different from the time for which the second weak-on voltage Vwo2 is applied. For example, the control logic 120 may control the voltage generator 130 and row decoder 140 so the first weak-on voltage Vwo1 is applied to the unselected string selection lines SSL_UN during a first interval TP1, and the second weak-on voltage Vwo2 is applied to unselected ground selection lines GSL_UN during a third interval TP3. A length of the third interval TP3 may be greater than a length of the first interval TP1.

In some example embodiment of inventive concepts, the voltages in the diagrams of FIGS. 14A and 14B may be applied to the circuit diagrams in FIGS. 5A and 5B of the present application the same way as discussed above with reference to paragraphs 12A and 12B.

Figure 15:
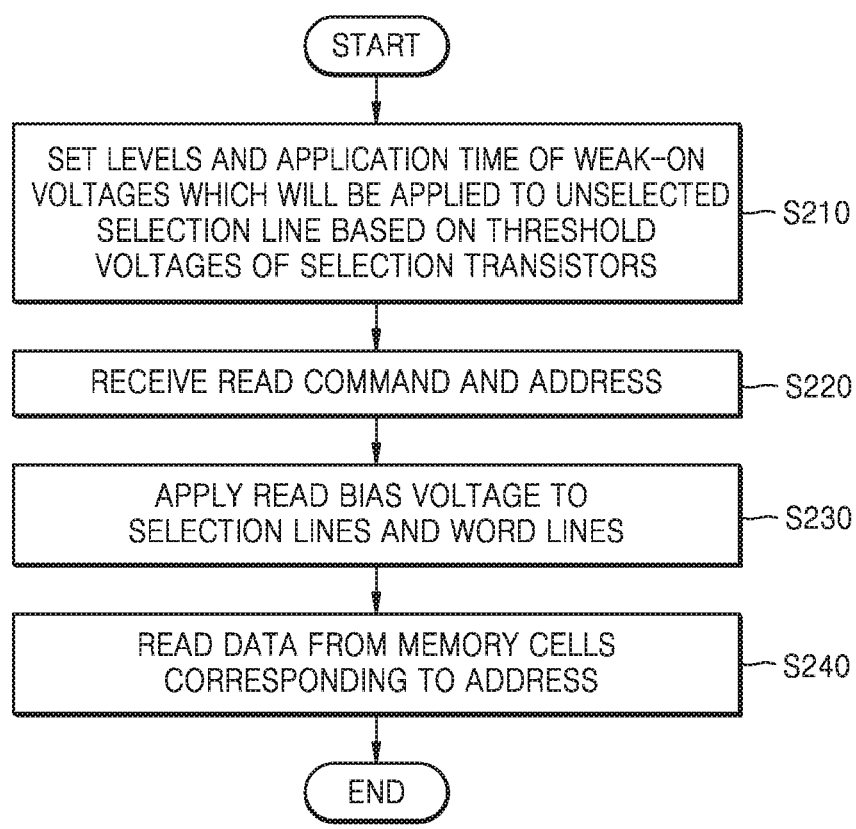
FIG. 15 is a flowchart illustrating a method of operating a memory device according to some example embodiments of inventive concepts.

FIG. 15 is a flowchart illustrating a method of operating the memory device 100 (see FIG. 1) according to some example embodiments of inventive concepts. Specifically, FIG. 15 illustrates a method of reading the memory device 100, and may include operations performed on the memory device 100 of FIG. 2 in time series. The above-described content with reference to FIGS. 1 to 14B may be applied to FIG. 15.

Referring to FIG. 15, in S210, the memory device 100 may set levels and application times of weak-on voltages which will be applied to unselected selection lines based on threshold voltages of the selection transistors. For example, operation S210 may be performed in the voltage controller 121 (see FIG. 2).

The levels of the threshold voltages of the selection transistors may be detected in a testing operation of the memory device 100 (see FIG. 1) and stored in the memory device 100. For example, the levels of the threshold voltages may be stored in a register or the like embedded in the memory device 100. Alternatively, the levels of the threshold voltages may be stored in the memory controller 200 (see FIG. 1).

In some example embodiments, the levels of the threshold voltages may be stored in units of memory blocks. For example, the threshold voltages of the selection transistors with respect to each of the plurality of memory blocks BLK1 to BLKz (see FIG. 2) may be detected, and the detected threshold voltages may be stored. However, inventive concepts are not limited thereto, and the levels of the threshold voltages may be stored in units greater or smaller than memory blocks.

The memory device 100 may set a level and application time of a first weak-on voltage, which will be applied to the unselected string selection lines based on the threshold voltage of the string selection transistor. A level and an application time of a second weak-on voltage, which will be applied to the unselected ground selection lines, may be set based on the threshold voltage of the ground selection transistor. As described above, the first weak-on voltage is set to be lower than the threshold voltage of the string selection transistor, and the second weak-on voltage is set to be lower than the threshold voltage of the ground selection transistor.

In some example embodiments, when the threshold voltage of the ground selection transistor is higher than the threshold voltage of the string selection transistor, the level of the second weak-on voltage may be set to be higher than the level of the first weak-on voltage. Alternatively, a time for which the second weak-on voltage is applied may be set to be longer than a time for which the first weak-on voltage is applied.

In some example embodiments, when the first memory block BLK1 of the plurality of memory blocks BLK1 to BLKz (see FIG. 2) includes a single-level cell and the second memory block BLK2 thereof includes a multi-level cell, threshold voltages of selection transistors included in the second memory block BLK2 may be higher than threshold voltages of selection transistors included in the first memory block BLK1. Levels of weak-on voltages provided to the second memory block BLK2 may be set to be higher than levels of weak-on voltages provided to the first memory block BLK1. Alternatively, a time for which the weak-on voltages provided to the second memory block BLK2 are applied may be set to be longer than a time for which the weak-on voltages provided to the first memory block BLK1 are applied.

In S220, the memory device 100 receives a read command and an address, and in S230, the memory device 100 applies a read bias voltage to selection lines and word lines in an area of the memory cell array 110 corresponding to the address. For example, the memory device 100 may apply the read bias voltage to a memory block of the plurality of memory blocks BLK1 to BLKz (see FIG. 2) corresponding to the address or selection lines and word lines of a sub block in the memory block. In this case, the read bias voltage is generally refers to voltages which are applied to the unselected selection lines, the selected selection lines, the selected word line, and the unselected word lines so that data is normally read. In this case, the weak-on voltages which are set in S210 may be applied to the unselected selection lines during the set application time.

In S240, the memory device 100 reads data from memory cells corresponding to the address. The memory device 100 may read the data by sensing the memory cells after a read setup interval.

Figure 16A:
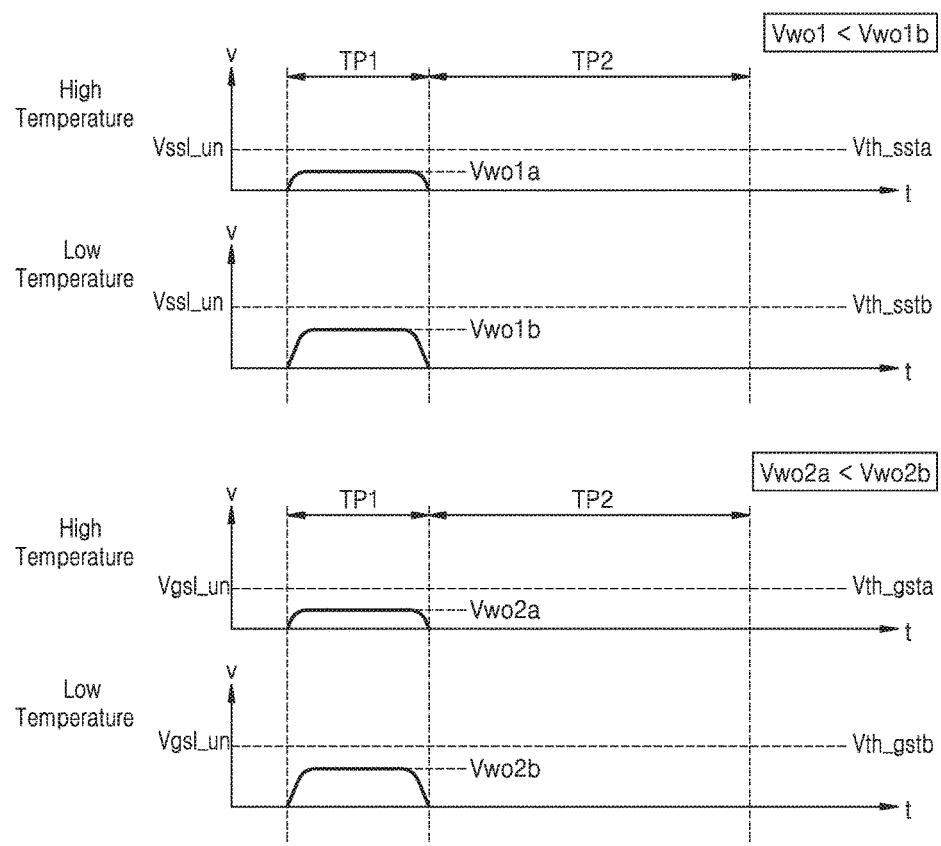
FIGS. 16A and 16B are timing diagrams illustrating waveforms of voltages applied to unselected selection lines according to some example embodiments of inventive concepts.
Figure 16B:
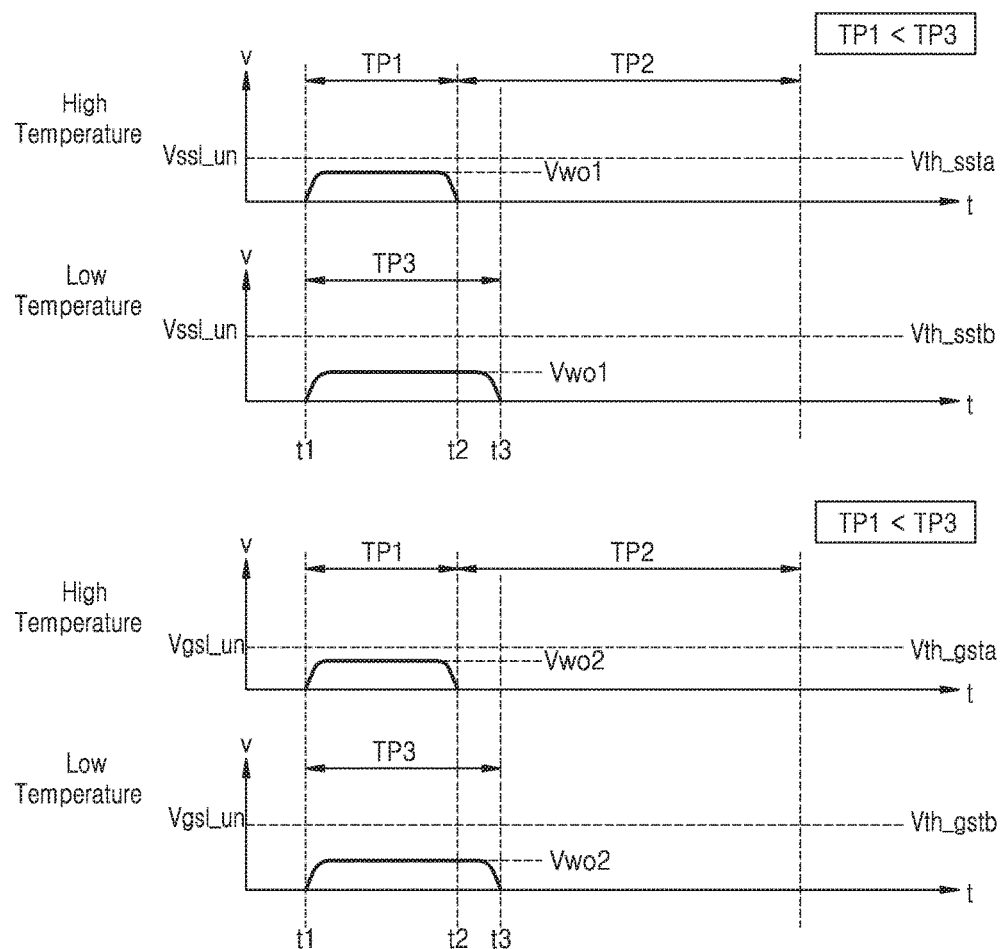

FIGS. 16A and 16B are timing diagrams illustrating waveforms of voltages applied to the unselected selection lines according to some example embodiments of inventive concepts. FIGS. 16A and 16B illustrate a level and application time of a weak-on voltage, which are set according to a temperature.

Referring to FIGS. 16A and 16B, a threshold voltage Vth_ssta of the string selection transistor SST at a high temperature may be lower than a threshold voltage Vth_sstb of the string selection transistor SST at a low temperature. A threshold voltage Vth_gsta of the ground selection transistor GST at a high temperature may be lower than a threshold voltage Vth_gstb of the ground selection transistor GST at a low temperature. Therefore, as illustrated in FIG. 16A, the control logic 120 may control the voltage generator 130 and row decoder 140 so a level of a first weak-on voltage Vwo1a at a high temperature may be set to be lower than a level of a first weak-on voltage Vwo1b at a low temperature, and/or a level of a second weak-on voltage Vwo2a at a high temperature may be set to be lower than a level of a second weak-on voltage Vwo2b at a low temperature. In other words, a level of a pre-pulse applied to the unselected string selection lines SSL_UN and/or ground selection lines GSL_UN may be adjusted according to the temperature. The level of the pre-pulse may be set to be low as the temperature is increased. The level of the pre-pulse may be set to be high as the temperature is decreased.

Alternatively, as illustrated in FIG. 16B, the control logic 120 may control the voltage generator 130 and row decoder 140 so a first interval TP1 in which the first weak-on voltage Vwo1 (and/or the second weak-on voltage Vwo2) is applied at a high temperature may be smaller than a third interval TP3 in which the first weak-on voltage Vwo1 (and/or the second weak-on voltage Vwo2) is applied at a low temperature. In other words, as a width of the pre-pulse applied to the unselected string selection lines SSL_UN (and/or unselected ground selection lines GSL_UN) may be adjusted according to the temperature, the width of the pre-pulse may be set to be small as the temperature is increased, and the width of the pre-pulse may be set to be large as the temperature is decreased.

Meanwhile, the first interval TP1 is the same as or greater than the read setup interval TPsetup (see FIG. 8). In FIG. 16B, the level of the first weak-on voltage Vwo1 at a high temperature may be the same as the level of the first weak-on voltage Vwo1 at a low temperature, and the level of the level of the second weak-on voltage Vwo2 at a high temperature may be the same as the level of the second weak-on voltage Vwo2 at a low temperature. However, inventive concepts are not limited thereto, and the level and application time of the first weak-on voltage Vwo1 and/or second weak-on voltage Vwo2 may be differently set according to the temperature.

In some example embodiment of inventive concepts, the voltages in the diagrams of FIGS. 16A and 16B may be applied to the circuit diagram in FIG. 5A of the present application, except the ground selection lines connected to the first ground selection transistor GST1 and the second ground selection transistor GST2 of the unselected string(s) may correspond to the unselected ground selection line GSL_UN.

In other words, referring to FIGS. 5A and 16A, during the first interval TP1, the control logic 120 may control the voltage generator 130 and row decoder 140 to adjust a level of the second weak-on voltage applied to the unselected ground selection lines GSL_UN (e.g., second and third ground selection lines GSL2a, GSL2b, GSL3a, and GSL3b of FIG. 5A), based on the temperature. The level of the second weak-on voltage Vwo2a at a high temperature may be set to be lower than the level of a second weak-on voltage Vwo2b at a low temperature. During the second interval TP2, the control logic 120 may control the voltage generator 130 and row decoder 140 to apply the turn-off voltage Voff to the unselected ground selection lines GSL_UN (e.g., second and third ground selection lines GSL2a, GSL2b, GSL3a, and GSL3b of FIG. 5A).

Referring to FIGS. 5A and 16B, the control logic 120 may control the voltage generator 130 and row decoder 140 to adjust a duration of the second weak-on voltage Vwo2 applied to the unselected ground selection lines GSL_UN (e.g., second and third ground selection lines GSL2a, GSL2b, GSL3a, and GSL3b of FIG. 5A), based on the temperature. For example, a first interval TP1 in which the second weak-on voltage Vwo2 is applied at a high temperature may be smaller than a third interval TP3 in which the second weak-on voltage Vwo2 is applied at a low temperature.

Alternatively, in some example embodiments, the ground selection lines connected to the second ground selection transistor GST2 of the unselected string(s) (e.g., GSL2a and GSL3a of FIG. 5A) may receive a voltage that is different than the second weak-on voltage, such as a turn off voltage Voff, during the first interval TP1 or third interval TP3 of the reading operation.

In some example embodiment of inventive concepts, the voltages in the diagrams of FIGS. 16A and 16B may be applied to the circuit diagram in FIG. 5B of the present application, except the ground selection line connected to the first ground selection transistor GST1 of the unselected cell string(s) may correspond to the unselected ground selection line GSL_UN.

In other words, referring to FIGS. 5B and 16A, during the first interval TP1, the control logic 120 may control the voltage generator 130 and row decoder 140 to adjust a level of the second weak-on voltage applied to the unselected ground selection lines GSL_UN (e.g., second and third ground selection line GSL2 and GSL3 of FIG. 5B), based on the temperature. The level of the second weak-on voltage Vwo2a at a high temperature may be set to be lower than the level of a second weak-on voltage Vwo2b at a low temperature. During the second interval TP2, the control logic 120 may control the voltage generator 130 and row decoder 140 to apply the turn-off voltage Voff to the unselected ground selection lines GSL_UN (e.g., second and third ground selection line GSL2 and GSL3 of FIG. 5B).

Referring to FIGS. 5B and 16B, the control logic 120 may control the voltage generator 130 and row decoder 140 to adjust a duration of the second weak-on voltage Vwo2 applied to the unselected ground selection lines GSL_UN (e.g., second and third ground selection line GSL2 and GSL3 of FIG. 5B), based on the temperature. For example, a first interval TP1 in which the second weak-on voltage Vwo2 is applied at a high temperature may be smaller than a third interval TP3 in which the second weak-on voltage Vwo2 is applied at a low temperature.

Figure 17:
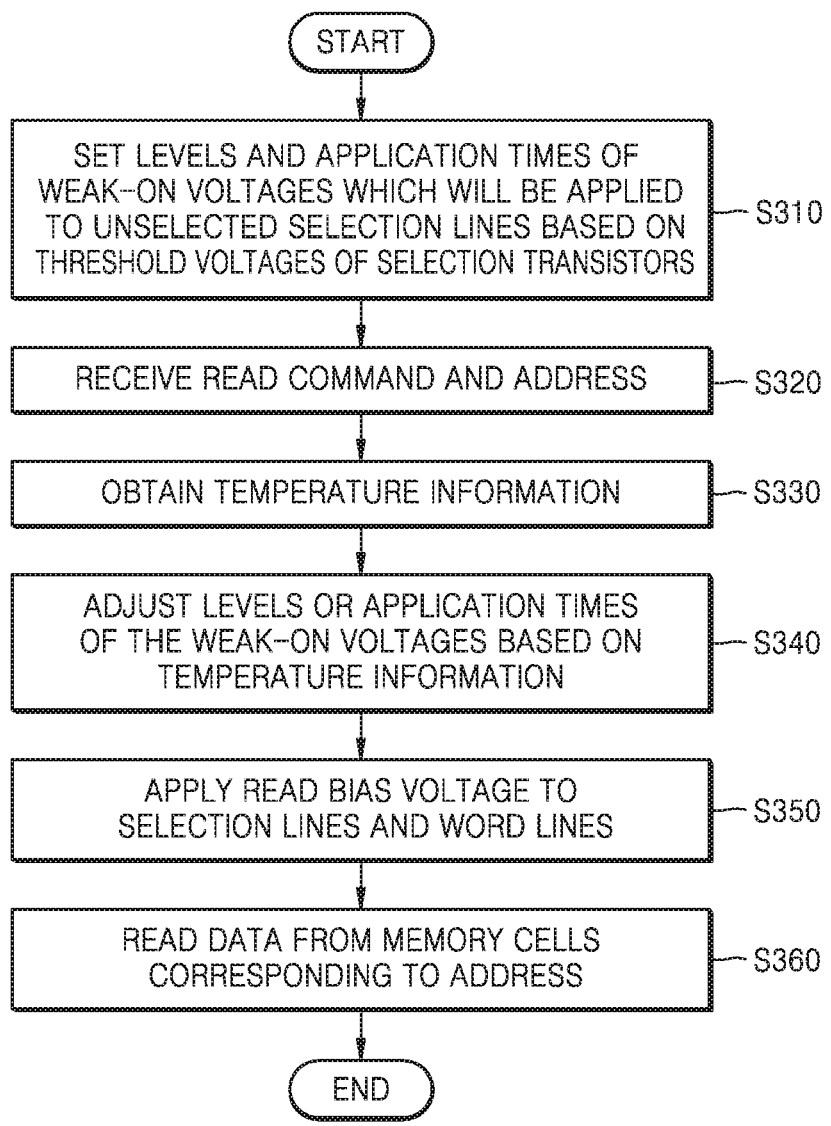
FIG. 17 is a flowchart illustrating a method of operating a memory device according to some example embodiments of inventive concepts.

FIG. 17 is a flowchart illustrating a method of operating the memory device 100 (see FIG. 1) according to some example embodiments of inventive concepts. Specifically, FIG. 17 illustrates a method of reading the memory device 100, and may include operations performed on the memory device 100 of FIG. 2 in time series. The above-described content with reference to FIGS. 1 to 16B may be applied to method described in FIG. 17.

Referring to FIG. 17, in S310, the memory device 100 sets levels and application times of weak-on voltages which will be applied to unselected selection lines based on threshold voltages of selection transistors. Since operation S310 is the same as operation S210 of FIG. 15, a description identical to that of operation S210 of FIG. 14 will be omitted.

In S320, the memory device 100 receives a read command and an address, and in S330, the memory device 100 obtains temperature information. In some example embodiments, the temperature information may be provided from a temperature detector provided inside the memory device 100 (see FIG. 1). In other example embodiments, the temperature information may be provided from the memory controller 200 (see FIG. 1).

In S340, the memory device 100 adjusts the levels or application times of the weak-on voltages based on the temperature information. For example, in S310, the memory device 100 may set default levels of the weak-on voltages or default times (or default application times) thereof based on a set reference temperature, and in S340, the memory device 100 may set the levels or application times of the weak-on voltages according to a change of temperature based on the default levels or default times and the temperature information. For example, the memory device 100 may adjust the levels of the weak-on voltages to be lower than the default level or the application times for which the weak-on voltages are applied to be shorter than default times in a case in which a temperature when the read command is received is higher than the reference temperature. In this case, the memory device 100 may set the levels or application times of the weak-on voltages according to the temperature by applying preset offset levels to the default levels or the default times corresponding to an amount of change of the temperature.

In S350, the memory device 100 applies a read bias voltage to the selection lines and the word lines, and in S360, the memory device 100 reads data from memory cells corresponding to the address. Since operations S350 and S360 are the same as operations S230 and S240 of FIG. 15, descriptions identical to those of operations S230 and S240 of FIG. 13 will be omitted.

Figure 18A:
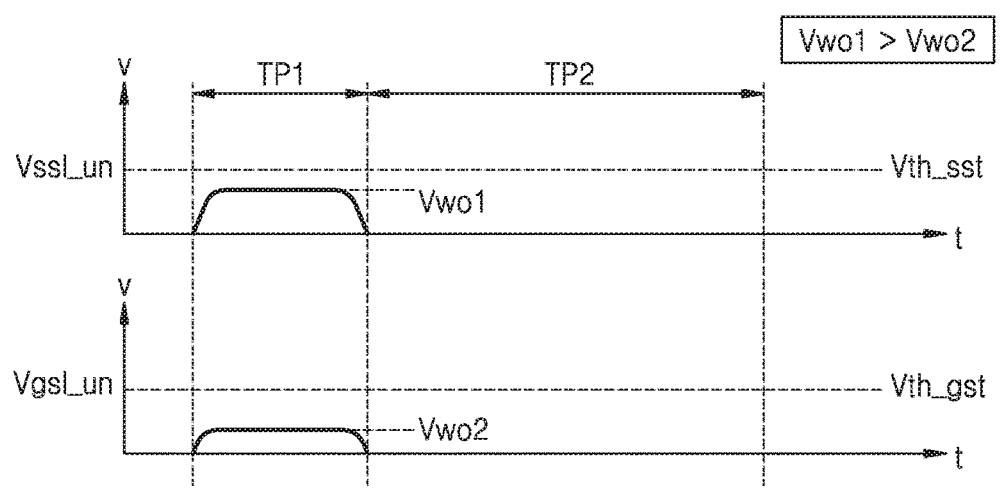
FIGS. 18A to 19B are timing diagrams illustrating waveforms of voltages applied to unselected selection lines according to some example embodiments of inventive concepts.
Figure 18B:
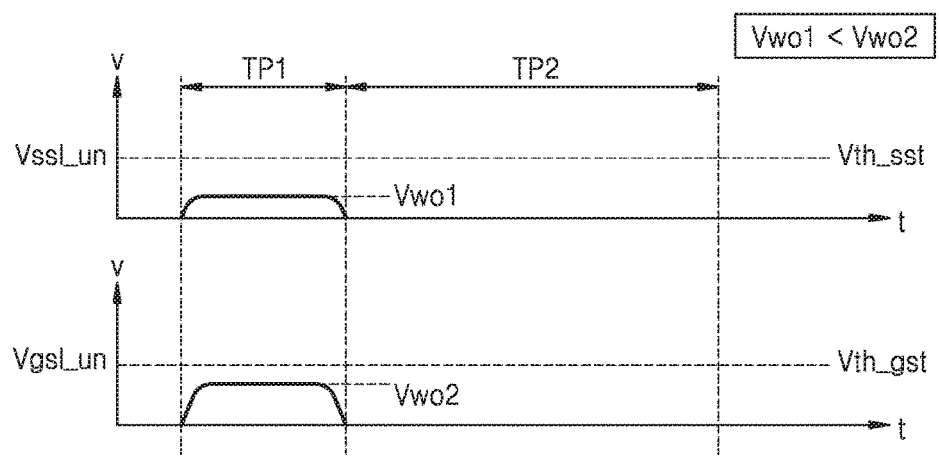
Figure 19A:
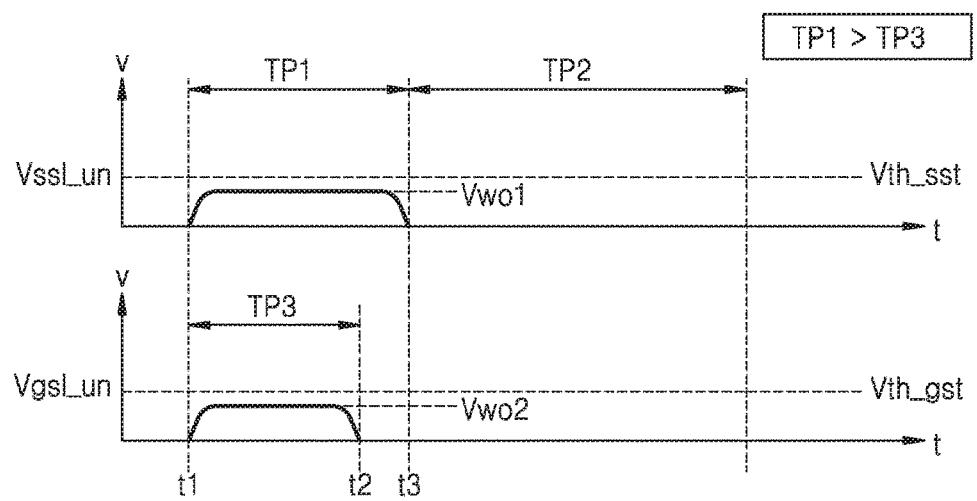
Figure 19B:
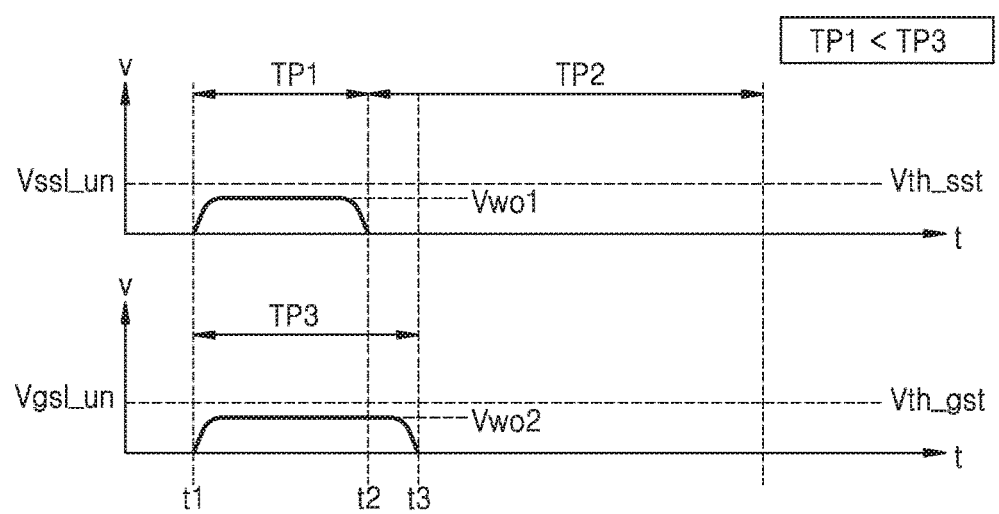

FIGS. 18A to 19B are timing diagrams illustrating waveforms of voltages applied to the unselected selection lines according to some example embodiments of inventive concepts. FIGS. 18A and 18B illustrate levels of weak-on voltages which are set according to a position of a selected word line, and FIGS. 19A and 19B illustrate a time for which the weak-on voltages are applied set according to the position of the selected word line. It is assumed that the threshold voltage Vth_sst of the string selection transistor SST is substantially the same as the threshold voltage Vth_gst of the ground selection transistor GST.

Referring to FIGS. 18A and 18B, the control logic 120 may control the voltage generator 130 and row decoder 140 so a level of a first weak-on voltage Vwo1 applied to unselected string selection lines SSL_UN may be set to be different from a level of a second weak-on voltage Vwo2 applied to unselected ground selection lines GSL_UN according to the position of the selected word line. In other words, a level of a pre-pulse applied to the unselected string selection lines SSL_UN may be different from a level of a pre-pulse applied to the unselected ground selection lines GSL_UN according to the position of the selected word line.

When the selected word line WL_SEL is closer (e.g., adjacent) to the ground selection line GSL than the string selection lines SSL, as illustrated in FIG. 18A, a level of the first weak-on voltage Vwo1 applied to the unselected string selection lines SSL_UN may be set to be higher than a level of the second weak-on voltage Vwo2 applied to the unselected ground selection lines GSL_UN.

When the selected word line WL_SEL is closer (e.g., adjacent) to the ground selection line GSL than the string selection line SSL, a boosting charge which will be removed from an upper area of a channel of the unselected cell string (e.g., an area between a string selection line and a selected word line) may be greater than a boosting charge which will be removed from a lower area of the channel thereof (e.g., an area between a ground selection line and a selected word line). Therefore, as the level of the first weak-on voltage Vwo1 is set to be higher than the level of the second weak-on voltage Vwo2 and an amount of a leakage current of the string selection transistor SST is relatively increased, a relatively large amount of boosting charge may be discharged from the upper area of the channel to the bit line BL. Thus, an imbalance of the boosting potential in the area of the channel may be limited and/or prevented.

When the selected word line WL_SEL is closer (e.g., adjacent) to the string selection line SSL than the ground selection line GSL, as illustrated in FIG. 18B, the level of the second weak-on voltage Vwo2 may be set to be higher than the level of the first weak-on voltage Vwo1.

When the selected word line WL_SEL is closer (e.g., adjacent) to the string selection line SSL than the ground selection line GSL, an amount of a boosting charge which will be removed from the lower area of the channel of the unselected cell string may be greater than an amount of a boosting charge which will be removed from the upper area of the channel thereof. Therefore, as the level of the second weak-on voltage Vwo2 is set to be higher than the level of the first weak-on voltage Vwo1 and an amount of a leakage current of the ground selection transistor GST is relatively increased, a relatively large amount of boosting charge may be discharged from the lower area of the channel to the common source line CSL.

Referring to FIGS. 19A and 19B, a length of a time at which the first weak-on voltage Vwo1 is applied may be set to be different from a length of a time at which the second weak-on voltage Vwo2 is applied according to the position of the selected word line. In other words, a width of a pre-pulse applied to the unselected string selection lines SSL_UN may be different from a width of a pre-pulse applied to the unselected ground selection lines GSL_UN according to the position of the selected word line.

When the selected word line WL_SEL is closer (e.g., adjacent) to the ground selection line GSL than the string selection line SSL, as illustrated in FIG. 19A, the control logic 120 may control the voltage generator 130 and row decoder 140 so a first interval TP1 in which the first weak-on voltage Vwo1 is applied may be set to be greater than a time interval TP3 for which the second weak-on voltage Vwo2 is applied. Further, when the selected word line WL_SEL is closer (e.g., adjacent) to the string selection line SSL than the ground selection line GSL, as illustrated in FIG. 19B, the control logic 120 may control the voltage generator 130 and row decoder 140 so the first interval TP1 in which the first weak-on voltage Vwo1 is applied may be set to be smaller than the third interval TP3 in which the second weak-on voltage Vwo2 is applied. Thus, an imbalance of the boosting potential that may be generated according to a position of the selected word line in the area of the channel may be limited and/or prevented from occurring.

Meanwhile, in a case in which a read operation is performed when a verification operation is performed after a program operation, a program pattern is determined according to the position of the selected word line WL_SEL. Therefore, when the levels or application times of the weak-on voltages are determined according to the position of the selected word line WL_SEL, a program pattern may be considered.

When a verification operation is performed, memory cells at a level higher than that of the selected word line WL_SEL may be in an erased state, and memory cells at a level lower than that of the selected word line WL_SEL may be in a programmed state. Thus, a channel boosting potential in an upper area of the channel may be higher than a channel boosting potential in a lower area of the channel. Therefore, in consideration of the program pattern, in the case in which the selected word line WL_SEL is closer (e.g., adjacent) to the ground selection line GSL when the verification operation is performed, a level of the second weak-on voltage Vwo2 may be set to be higher than the level of the second weak-on voltage Vwo2 illustrated in FIG. 18A, and a level of the first weak-on voltage Vwo1 may be set to be lower than the level of the first weak-on voltage Vwo1 illustrated in FIG. 18A. Conversely, in the case in which the selected word line WL_SEL is closer (e.g., adjacent) to the string selection line SSL when the verification operation is performed, a level of the second weak-on voltage Vwo2 may be set to be lower than the level of the second weak-on voltage Vwo2 illustrated in FIG. 18B, and a level of the first weak-on voltage Vwo1 may be set to be higher than the level of the first weak-on voltage Vwo1 illustrated in FIG. 18B.

Further, in the case in which the selected word line WL_SEL is closer (e.g., adjacent) to the ground selection line GSL when the verification operation is performed, the first interval TP1 in which the first weak-on voltage Vwo1 is applied may be set to be greater than the first interval TP1 illustrated in FIG. 19A, and a third interval T3 in which the second weak-on voltage Vwo2 is applied may be set to be smaller than the third interval TP3 illustrated in FIG. 19A. When the selected word line WL_SEL is closer (e.g., adjacent) to the string selection line SSL, the first interval TP1 in which the first weak-on voltage Vwo2 is applied may be set to be greater than the first interval TP1 illustrated in FIG. 19B, and the third interval TP3 in which the second weak-on voltage Vwo2 is applied may be set to be smaller than the third interval TP3 illustrated in FIG. 19B.

In some example embodiment of inventive concepts, the voltages in the diagrams of FIGS. 18A, 18B, 19A, and 19B may be applied to the circuit diagram in FIG. 5A of the present application, except the ground selection lines connected to the first ground selection transistor GST1 and the second ground selection transistor GST2 of the unselected string(s) may correspond to the unselected ground selection line GSL_UN. When the selected word line WL_SEL is closer (e.g., adjacent) to the ground selection line GSL than the string selection lines SSL, as illustrated in FIG. 18A, the first interval TP1 in which the first weak-on voltage Vwo1 is applied to the unselected string selection lines SSL_UN may be set to be greater than the time interval TP3 for which the second weak-on voltage Vwo2 is applied to the unselected ground selection lines GSL_UN (e.g., second and third ground selection lines GSL2a, GSL2b, GSL3a, and GSL3b of FIG. 5A). Conversely, as shown in FIG. 19B, when the selected word line WL_SEL is closer (e.g., adjacent) to the string selection lines SSL than the ground selection lines GSL, the first interval TP1 in which the first weak-on voltage Vwo1 is applied to the unselected string selection lines SSL_UN may be set to be less than the time interval TP3 for which the second weak-on voltage Vwo2 is applied to the unselected ground selection lines GSL_UN (e.g., second and third ground selection lines GSL2a, GSL2b, GSL3a, and GSL3b of FIG. 5A).

Referring to FIGS. 19A and/or 19B, the control logic 120 may control the voltage generator 130 and row decoder 140 to apply the turn-off voltage Voff to the unselected ground selection lines GSL_UN (e.g., second and third ground selection lines GSL2a, GSL2b, GSL3a, and GSL3b of FIG. 5A) when the third interval ends at time t2 in FIG. 19A or at time t3 in FIG. 19B. Alternatively, in some example embodiments, the ground selection lines connected to the second ground selection transistor GST2 of the unselected string(s) (e.g., GSL2a and GSL3a of FIG. 5A) may receive a voltage that is different than the second weak-on voltage, such as a turn off voltage Voff, after the third interval TP3 of the reading operation.

In some example embodiment of inventive concepts, the voltages in the diagrams of FIGS. 18A, 18B, 19A, and 19B may be applied to the circuit diagram in FIG. 5B of the present application, except the ground selection line connected to the first ground selection transistor GST1 of the unselected string(s) may correspond to the unselected ground selection line GSL_UN. When the selected word line WL_SEL is closer (e.g., adjacent) to the ground selection line GSL than the string selection lines SSL, as illustrated in FIG. 18A, the first interval TP1 in which the first weak-on voltage Vwo1 is applied to the unselected string selection lines SSL_UN may be set to be greater than the time interval TP3 for which the second weak-on voltage Vwo2 is applied to the unselected ground selection lines GSL_UN (e.g., second and third ground selection line GSL2 and GSL3 of FIG.). Conversely, as shown in FIG. 19B, when the selected word line WL_SEL is closer (e.g., adjacent) to the string selection lines SSL than the ground selection lines GSL, the first interval TP1 in which the first weak-on voltage Vwo1 is applied to the unselected string selection lines SSL_UN may be set to be less than the time interval TP3 for which the second weak-on voltage Vwo2 is applied to the unselected ground selection lines GSL_UN (e.g., second and third ground selection line GSL2 and GSL3 of FIG. 5B).

Referring to FIGS. 19A and/or 19B, the control logic 120 may control the voltage generator 130 and row decoder 140 to apply the turn-off voltage Voff to the unselected ground selection lines GSL_UN (e.g., second and third ground selection line GSL2 and GSL3 of FIG. 5B) when the third interval ends at time t2 in FIG. 19A or at time t3 in FIG. 19B.

Figure 20:
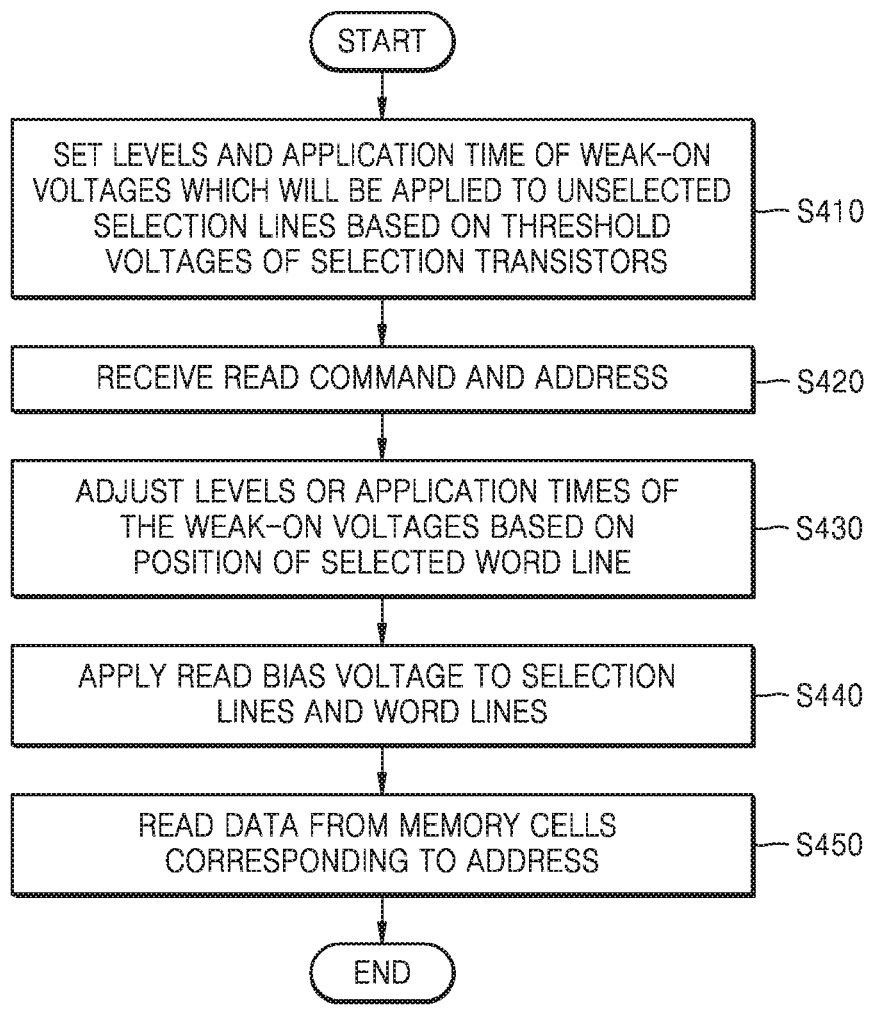
FIG. 20 is a flowchart illustrating a method of operating a memory device according to some example embodiments of inventive concepts.

FIG. 20 is a flowchart illustrating a method of operating the memory device 100 (see FIG. 1) according to some example embodiments of inventive concepts. Specifically, FIG. 20 illustrates a method of reading the memory device, and may include operations performed on the memory device 100 of FIG. 2 in time series. The above-described content with reference to FIGS. 1 to 19B may be applied to the method in FIG. 20.

Referring to FIG. 20, in S410, the memory device 100 sets levels and application time of weak-on voltages that will be applied to unselected selection lines based on threshold voltages of the selection transistors. Since operation S410 is the same as operation S210 of FIG. 15, a description identical to that of operation S210 of FIG. 13 will be omitted.

In S420, the memory device 100 receives a read command and an address.

In S430, the memory device 100 adjusts the levels or application times of the weak-on voltages based on a position of a selected word line.

As described with reference to FIGS. 18A to 19B, the levels or application times of the weak-on voltages may be set based on the position of the selected word line.

In some example embodiments, the memory device 100 may set the levels of the weak-on voltages or a default level of the application time thereof based on a reference position of the selected word line in S410, and the memory device 100 may set the levels or application times of the weak-on voltages according to the position of the word line based on the default level and the position of the selected word line in S430. For example, the memory device 100 may adjust the levels or application times of the weak-on voltages based on the position of the selected word line according to whether the position of the selected word line is closer than the reference position to a string selection line or to a ground selection line. The memory device 100 may adjust the levels or application times of the weak-on voltages according to the selected word line by applying preset offset levels to the default level corresponding to the position of the selected word line.

In S440, the memory device 100 may apply a read bias voltage to the selection lines and the word lines, and in S450, the memory device 100 reads data from memory cells corresponding to the address. Since operations S440 and S450 are the same as operations S230 and S240 of FIG. 15, descriptions identical to those of operations S230 and S240 of FIG. 15 will be omitted.

Meanwhile, the memory device 100 may perform a read operation when a verification operation is performed, and in this case, operation S420 may be omitted. In S430, when the memory device 100 adjusts the levels or application times of the weak-on voltages based on the position of the selected word line, a program pattern according to the position of the selected word line may be applied as described above.

Figure 21:
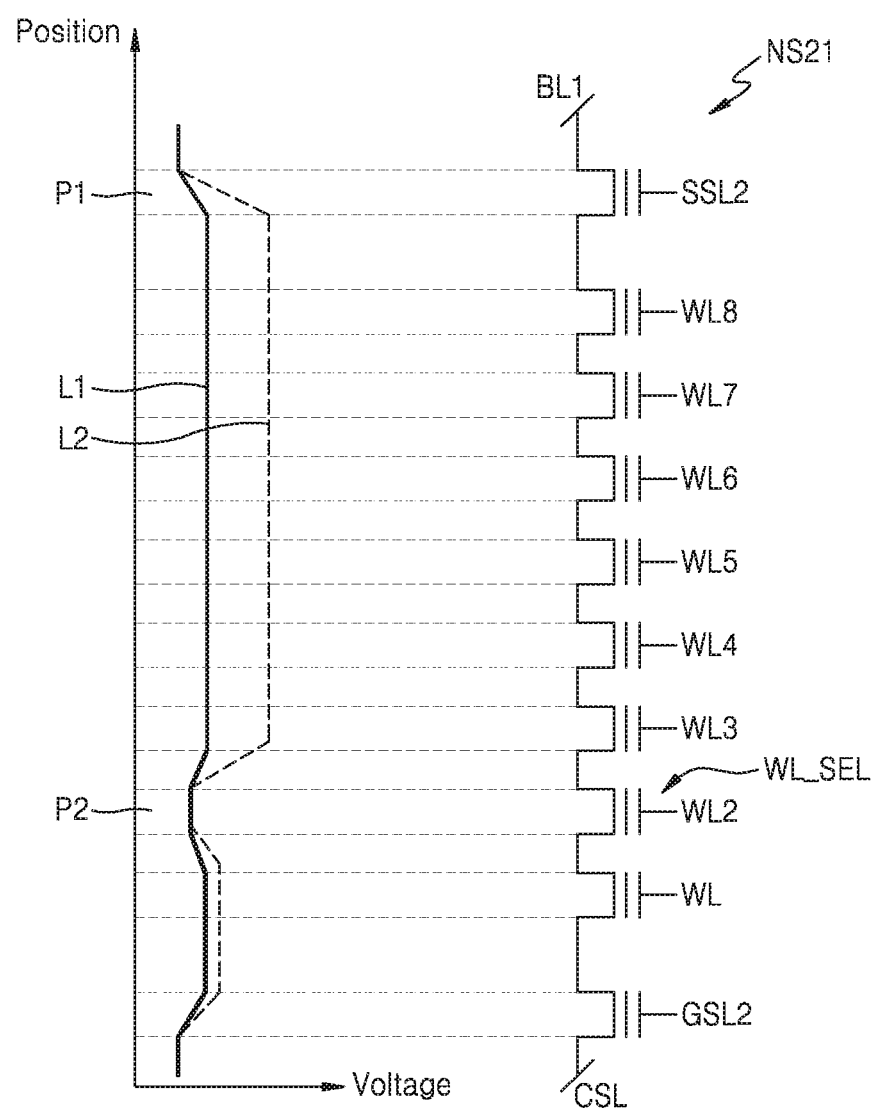
FIG. 21 is a diagram illustrating an example of a boosting potential of a channel of an unselected cell string when a read bias voltage is applied according to a method of reading the memory device according to some example embodiments of inventive concepts.

FIG. 21 is a diagram illustrating an example of a boosting potential of a channel of an unselected cell string when a read bias voltage is applied according to the method of reading the memory device according to some example embodiments of inventive concepts.

In a graph of FIG. 21, a horizontal axis represents a potential of a channel and a vertical axis represents a height of the channel (or a position of a channel area corresponding to selection lines and word lines). In the graph of FIG. 21, a first line L1 illustrated as a solid line represents a channel boosting potential of an unselected cell string when weak-on voltages are applied to unselected selection lines according to a method of reading of the memory device according to some example embodiments of inventive concepts described with reference to FIGS. 1 to 20B, and a second line L2 illustrated as a dotted line represents a channel boosting potential of the unselected cell string according to another method of reading of the memory device as a comparative example. Referring to the second line L2, a boosting potential at an upper portion of a channel area is higher than a boosting potential at a lower portion of the channel area based on the selected word line WL_SEL, and thus an imbalance between the boosting potentials in the channel may occur. Thus, a program that is not wanted is performed at a first position P1 and a second position P2 according to HCI, and thus a reading disturbance may occur. However, when the weak-on voltage is applied to the unselected selection lines according to some example embodiments of inventive concepts, as the string selection transistor and the ground selection transistor of the unselected cell string may be weakly turned-on and a leakage current flows and an amount of the leakage current may be adjusted according to the levels or application times of the weak-on voltages, a boosting potential of the channel may be increased to an appropriate level, and the boosting potential in the channel may be uniform. Therefore, a reading disturbance is reduced, and the reliability of the read operation may be improved.

Figure 22:
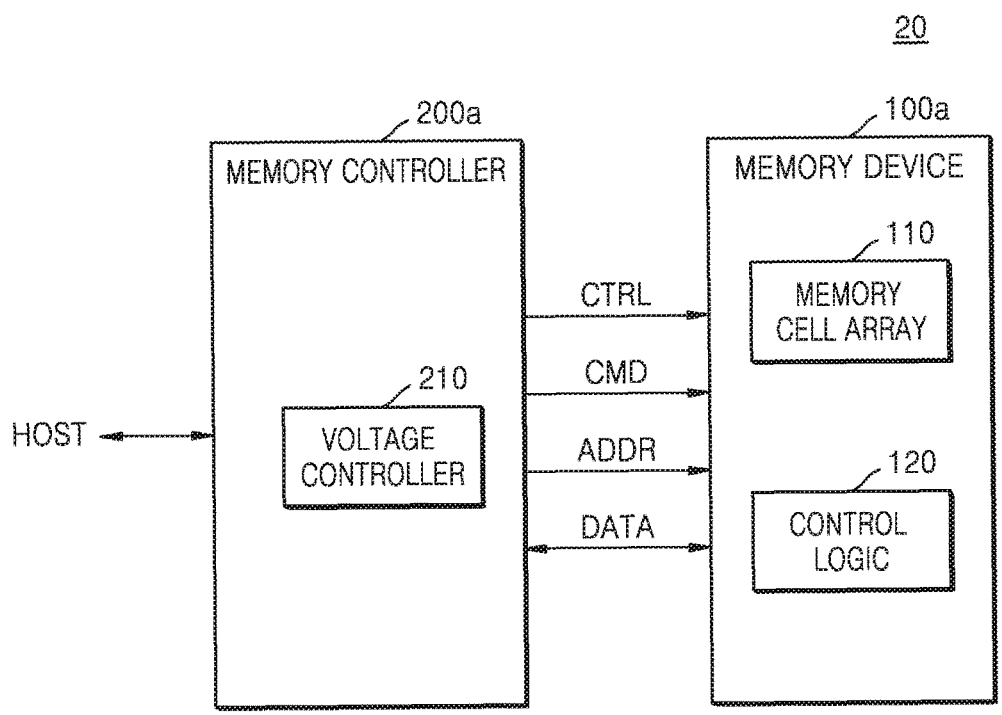
FIG. 22 is a block diagram schematically illustrating a memory system according to some example embodiments of inventive concepts.

FIG. 22 is a block diagram schematically illustrating a memory system according to some example embodiments of inventive concepts.

Referring to FIG. 22, a memory system 20 may include a memory device 100a and a memory controller 200a, and the memory device 100a may include the memory cell array 110 and the control logic 120. The memory device 100a may be the same as or substantially similar to the memory device 100 of FIG. 1. Therefore, the above-described content with reference to FIGS. 1 to 20B may be applied to FIG. 22, and descriptions identical to those of FIGS. 1 to 20B will be omitted.

The memory controller 200a may include a voltage controller 210, and the voltage controller 210 may generate a voltage control signal which is used to generate bias voltages applied to the memory cell array 110, for example, a word line voltage for driving the word lines WL, a string selection line voltage for driving the string selection lines SSL, and a ground selection line voltage for driving the ground selection lines GSL.

The voltage controller 210 may generate a voltage control signal which controls the string selection line voltage and the ground selection line voltage so that weak-on voltages having levels lower than levels of threshold voltages of selection transistors are applied to unselected selection lines in at least part of a reading interval in which a read operation is performed on the memory cell array 110. The memory controller 200a may transmit the voltage control signal to the memory device 100a through a command CMD, an address ADDR, data DATA, or a control signal CTRL.

In some example embodiments, the voltage controller 210 may generate a voltage control signal which changes levels or application times of the weak-on voltages based on at least one of levels of the threshold voltages of the selection transistors, sizes of the selection transistors, a temperature, a position of the word line (or the address ADDR) on which a read operation is performed, and a program pattern.

Figure 23:
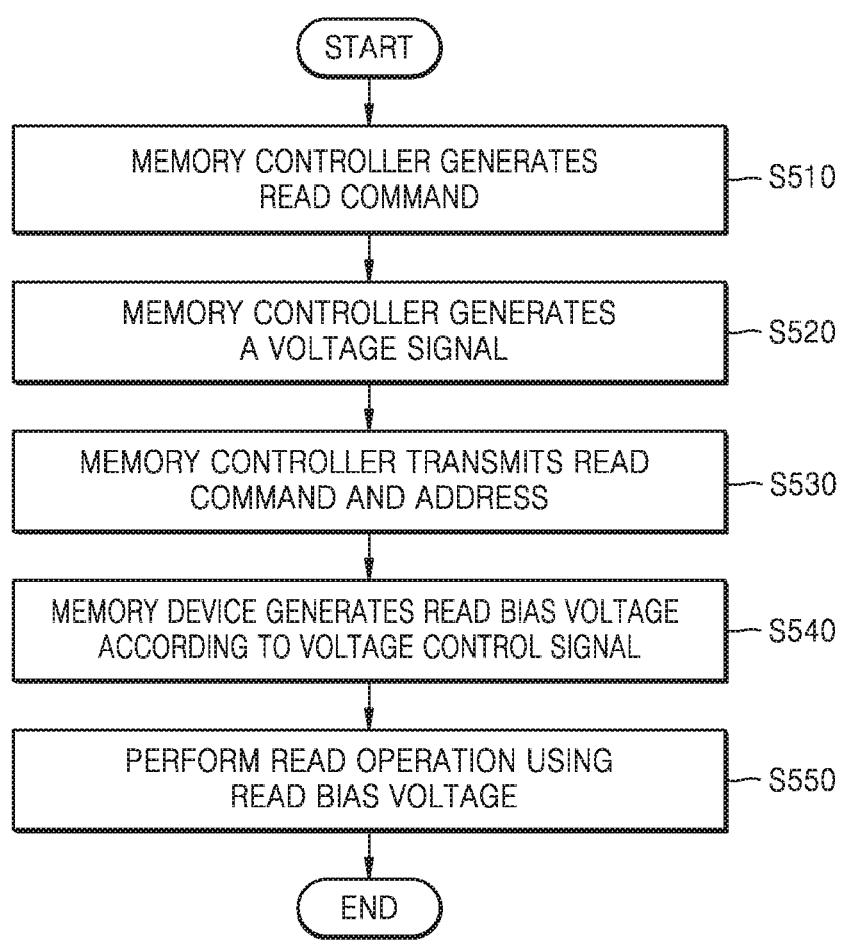
FIG. 23 is a flowchart illustrating operations of a memory controller and a memory device according to some example embodiments of inventive concepts.

FIG. 23 is a flowchart illustrating operations of the memory controller 200a and the memory device 100a according to some example embodiments of inventive concepts.

Referring to FIG. 23, in S510, the memory controller 200a may generate a read command. In S520, the memory controller 200a generates a voltage control signal. Specifically, the memory controller 200a may generate a voltage control signal which controls a string selection line voltage and a ground selection line voltage so that weak-on voltages having levels lower than levels of the threshold voltages of the selection transistors are applied to unselected selection lines in at least part of a reading interval.

In S530, the memory controller 200a transmits a command, an address, data, or a control signal to the memory device 100a. A voltage control signal may be transmitted to the memory device 100a through the command, the address, the data, or the control signal.

In S540, the memory device 100a generates a read bias voltage according to the received control signal. The read bias voltage may be a word line voltage, string selection line voltages, and ground selection line voltages. In this case, the memory device 100a may generate weak-on voltages provided to the unselected selection lines according to the control signal. The memory device 100a may adjust the levels of the weak-on voltages or the time for which the weak-on voltages are applied according to the control signal.

In S550, the memory device 100a performs a read operation on the memory cell array 110 using the generated read bias voltage.

Figure 24:
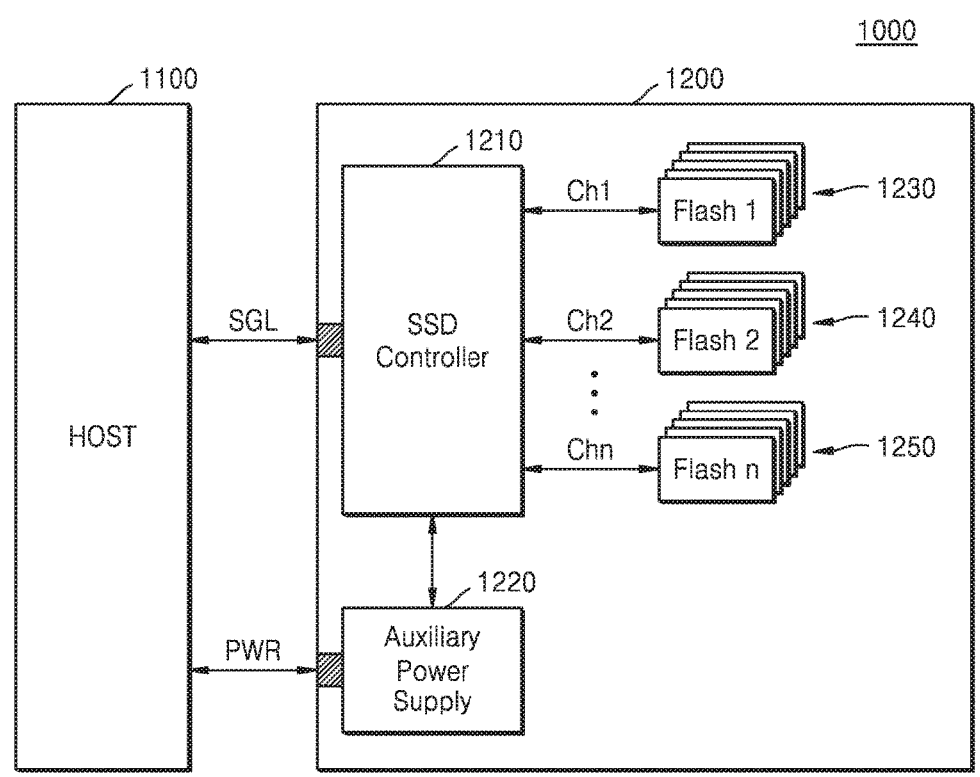
FIG. 24 is a block diagram illustrating an example in which a memory device according to some example embodiments of inventive concepts is applied to a solid-state drive (SSD) system.

FIG. 24 is a block diagram illustrating an example in which a memory devices according to some example embodiments of inventive concepts is applied to a solid-state drive (SSD) system 1000.

Referring to FIG. 24, the SSD system 3000 may include a host 1100 and an SSD 1200. The SSD 1200 exchanges a signal with the host 1100 through a signal connector, and receives power through a power connector. The SSD 1200 may include an SSD controller 1210, an auxiliary power supply 1220, and a plurality of memory devices 1230, 1240, and 1250. In this case, the SSD 1200 may be implemented using any one of the above-described example embodiments described in FIGS. 1 to 23.

For example, the memory device 100 of FIG. 2 may be applied to at least one of the flash memory devices 1230 to 1250. Thus, when a read operation is performed, at least one of the flash memory devices 1230 to 1250 may apply weak-on voltages lower than threshold voltages of selection transistors to unselected selection lines in at least part of a reading interval, for example, in a read setup interval. Further, levels of the weak-on voltages and times for which the weak-on voltages are applied may be adjusted based on at least one of the threshold voltages of the selection transistors, sizes of the selection transistors, a temperature, a position of the selected word line, and a program pattern. Thus, a boosting potential of a channel of an unselected cell string may be limited and/or prevented from being excessively increased, the boosting potential in the channel may be uniform, and thus a reading disturbance may be limited and/or prevented from occurring. Therefore, the read reliability of the SSD 1200 may be improved.

The memory device according to some example embodiments of inventive concepts may be mounted on or applied to a memory card system, a computing system, a universal flash storage (UFS), or the like in addition to the SSD 1200. Further, another method of operating the memory device according to some example embodiments of inventive concepts may be applied to various types of electronic systems on which a nonvolatile memory device is mounted.

As described above, various example embodiments of inventive concepts have been described above with reference to the accompanying drawings. Meanwhile, while specific embodiments have been described above, inventive concepts may be modified in several different forms without departing from the spirit and scope of inventive concepts. Therefore, the scope of inventive concepts is defined not by the above-described embodiments but by the appended claims, and encompasses equivalents that fall within the scope of the appended claims.

What is claimed is:

1. A nonvolatile memory device, comprising:
   a memory cell array including strings connected to bit lines, word lines, string selection lines, and ground selection lines,
      each of the strings including memory cells connected in series between a string selection transistor and a ground selection transistor; and
   a control logic coupled to the memory cell array,
      the control logic being configured to control a first weak-on voltage applied to an unselected string selection line among the string selection lines and a second weak-on voltage applied to an unselected ground selection line among the ground selection lines during a setup interval of a sensing operation for sensing data from a selected string among the strings,
      the unselected string selection line and the unselected ground selection line being connected to the string selection transistor and the ground selection transistor, respectively, of a same unselected string among the strings,
      the selected string and the unselected string being connected in common to a same one of the bit lines,
      a level of the first weak-on voltage being less than a threshold voltage of the string selection transistor in the unselected string and greater than a ground voltage, and
      a level of the second weak-on voltage being less than a threshold voltage of the ground selection transistor of the unselected string and greater than the ground voltage.

2. The nonvolatile memory device of claim 1, wherein the sensing operation is a read operation, and the setup interval is a read setup interval.

3. The nonvolatile memory device of claim 1, wherein the sensing operation is a program verification operation, and the setup interval is a verification setup interval.

4. The nonvolatile memory device of claim 1, wherein the level of the first weak-on voltage is different than the level of the second weak-on voltage.

5. The nonvolatile memory device of claim 1, wherein the level of the first weak-on voltage is equal to the level of the second weak-on voltage.

6. The nonvolatile memory device of claim 1, wherein the control logic is configured to control the first weak-on voltage applied to the unselected string selection line and the second weak-on voltage applied to the unselected ground selection line to have a same level during the setup interval.

7. The nonvolatile memory device of claim 6, wherein the sensing operation includes a sensing interval after the setup interval, the control logic is configured to control a turn-off voltage applied to the unselected string selection line and the unselected ground selection line during the sensing interval.

8. The nonvolatile memory device of claim 7, wherein the control logic is configured to control the turn-off voltage applied to the unselected string selection line and the unselected ground selection line to begin at a same time during the sensing interval.

9. The nonvolatile memory device of claim 7, wherein the control logic is configured to control the turn-off voltage applied to the unselected string selection line and the unselected ground selection line during the sensing interval to begin at different times during the sensing interval.

10. The nonvolatile memory device of claim 1, wherein a pulse width of the first weak-on voltage is equal to a pulse width of the second weak-on voltage.

11. The nonvolatile memory device of claim 1, wherein the control logic is configured to control the first weak-on voltage applied to the unselected string selection line and the second weak-on voltage applied to the unselected ground selection line to have a same pulse-width during the setup interval.

12. The nonvolatile memory device of claim 1, wherein the level of the first weak-on voltage is less different from the level of the second weak-on voltage.

13. The nonvolatile memory device of claim 1, wherein the ground selection transistor in each of the strings is a first ground selection transistor,
   each of the strings further includes a second ground selection transistor arranged so the first ground selection transistor is between the memory cells and the second ground selection transistor, and
   the control logic is configured to control the second weak-on voltage applied to the unselected ground selection line that is connected to the first ground selection transistor of the same unselected string during the set up interval of the sensing operation.

14. A nonvolatile memory device, comprising:
a memory cell array including strings connected to bit lines,
  each of the strings including memory cells connected in series between a string selection transistor and a ground selection transistor;
a row decoder connected to the strings through word lines, string selection lines, and ground selection lines;
a voltage generator connected to the row decoder; and
a control logic coupled to the row decoder and the voltage generator,
  the control logic being configured to control the voltage generator and the row decoder to apply a first weak-on voltage to an unselected string selection line among the string selection lines and a second weak-on voltage to an unselected ground selection line among the ground selection lines during a setup interval of a sensing operation for sensing data from a selected string among the strings,
  the unselected string selection line and the unselected ground selection line being connected to the string selection transistor and the ground selection transistor, respectively, of a same unselected string among the strings,
  the selected string and the unselected string being connected in common to a same one of the bit lines,
  a level of the first weak-on voltage being less than a threshold voltage of the string selection transistor in the unselected string and greater than a ground voltage, and a level of the second weak-on voltage being less than a threshold voltage of the ground selection transistor of the unselected string and greater than the ground voltage.

15. A control logic, comprising
a voltage controller configured to provide a row address and a column address to a row decoder and a page buffer, respectively, that are coupled to a memory cell array, based on a command, address, and control signal received from an external host,
  the voltage controller being configured to generate a voltage control signal for controlling a voltage generator coupled to the row decoder, such that the voltage generator and the row decoder are controlled to apply a first weak-on voltage to an unselected string selection line and a second weak-on voltage to an unselected ground selection line during a setup interval of a sensing operation for sensing data from a selected string of the memory cell array,
  the unselected string selection line and the unselected ground selection line being connected to a same unselected string,
  the selected string and the unselected string being connected to a same bit line,
a level of the first weak-on voltage being less than a threshold voltage of a string selection transistor of the unselected string and greater than a ground voltage, and
a level of the second weak-on voltage being less than a threshold voltage of a ground selection transistor of the unselected string and greater than the ground voltage.

* * * * *